United States Patent [19]

Ikeyama et al.

[11] Patent Number: 5,512,894
[45] Date of Patent: Apr. 30, 1996

[54] RATE CONVERTER FOR CONVERTING DATA RATE

[75] Inventors: Hiromasa Ikeyama; Takashi Asaida, both of Kanagawa, Japan

[73] Assignee: Sony Corporation, Tokyo, Japan

[21] Appl. No.: 76,839

[22] Filed: Jun. 15, 1993

[30] Foreign Application Priority Data

Jun. 22, 1992 [JP] Japan .................................... 4-185774

[51] Int. Cl.$^6$ ................................................. H03M 7/00
[52] U.S. Cl. ............................................................ 341/61
[58] Field of Search ............................ 341/61, 144, 155, 341/123; 364/724.1

[56] References Cited

U.S. PATENT DOCUMENTS 5,272,524   12/1993   Nagumo et al. ............................ 358/41

FOREIGN PATENT DOCUMENTS 2285024   4/1976   France .
2180114   3/1987   United Kingdom .

Primary Examiner—Brian K. Young
Attorney, Agent, or Firm—William S. Frommer; Alvin Sinderbrand

[57] ABSTRACT

A rate converter for converting data rate is adapted to hold, at an output clock rate, by using a plurality of latch circuits, respective signals from the output stages of a shift register operative at an input clock rate to multiply, at the output clock rate by using a plurality of multipliers, held signals from the latch circuits by filter coefficients that a plurality of coefficient generators sequentially generate to add the multiplied outputs by using an adder to provide a rate converted output signal. Thus, this rate converter makes it possible to carry out rate conversion by a single digital filter without necessity of digital filters operative at a clock rate of the least common multiple of the input clock rate and the output clock rate.

7 Claims, 17 Drawing Sheets

RATE CONVERTER FOR CONVERTING DATA RATE

BACKGROUND OF THE INVENTION

1. Field of the Invention

This invention relates to a rate converter for converting a rate of data in order to carry out transmission/reception (transfer) of data between digital circuits operative at two different clock rates.

2. Description of the Related Art

Generally, in order to carry out transmission and reception of data between digital circuits operative at two different clock rates, a rate converter for converting a rate of data is required.

For example, in the case of carrying out transmission and reception of digital video signals between a digital video signal processing circuit of an imaging apparatus operative at a clock rate of 18 MHz and a digital video signal processing circuit of a digital video tape recorder in conformity with the D1 standard operative at a clock rate of 13.5 MHz, rate converters such as a down-rate converter for converting a rate of a digital video signal outputted from the imaging apparatus from 18 MHz to 13.5 MHz, and an up-rate converter for converting a rate of a digital video signal outputted from the digital video tape recorder from 13.5 MHz to 18 MHz, etc. are required.

A conventional rate converter is adapted to apply up-conversion to input data so that its clock rate becomes equal to a clock rate of the least common multiple of an input clock rate and an output clock rate to implement thinning processing thereto by using a filter to thereby provide output data of a target output clock rate. For such a conventional rate converter, a filtering processing at the clock rate of the least common multiple is required.

For example, in a down-rate converter, input data having a clock rate of 18 MHz is converted to output data having a clock rate of 13.5 MHz by a filtering processing as shown in FIGS. 1 and 2.

Namely, in the down-rate converter, 0 data are first inserted into portions which can be sampling points of 13.5 MHz, as shown at B in FIG. 1, with respect to input data $\{X_n\}$ having a clock rate of 18 MHz as shown at A in FIG. 1 to up-convert the clock rate of the input data $\{X_n\}$ so as to become equal to a frequency of the least common multiple of 18 MHz and 13.5 MHz, i.e., a clock rate of 54 MHz. Thus, in the frequency region, frequency components which have repeated with a frequency of 18 MHz being as a unit as shown at A of FIG. 2 change into frequency components repeating with a frequency of 54 MHz being as a unit while the frequency characteristic is as it is as shown at B of FIG. 2.

Then, a filter of a characteristic as shown at C of FIG. 1 and C of FIG. 2 is applied to the data having the clock rate of 54 MHz. Namely, since the output clock rate is 13.5 MHz, if there is any frequency component more than 6.75 MHz which is one half of 13.5 MHz in a frequency range up to 27 MHz which is one half of 54 MHz, any arising noise or error might take place by the sampling theorem when the clock rate is caused to be 13.5 MHz, thus failing to maintain the original frequency characteristic. For this reason, a low-pass filter for suppressing frequency components more than 6.75 MHz is applied.

Here, data $\{Y_n\}$ having a clock rate of 54 MHz which has suppressed frequency components more than 6.75 MHz is subjected to a filtering processing of a transfer function $F_1(z)$ indicated by the following formula (1) where, e.g., the number of taps is set to 12 in a digital filter operative at 54 MHz with respect to input data $X_n = Z^n \cdot X_1$ $$F_1(z) = \sum_{i=0}^{11} K \cdot z^{-i} \tag{1}$$

By implementing the filtering processing of the transfer function $F_1(z)$ indicated by the above-mentioned formula (1) to data $\{Y_n\}$, data $Y_1 \sim Y_{14}$ as indicated by the following formula (2) are provided.

$$\begin{aligned}
Y_1 &= k_2 \cdot X_4 + k_5 \cdot X_3 + k_8 \cdot X_2 + k_{11} \cdot X_1 \\
Y_2 &= k_0 \cdot X_5 + k_3 \cdot X_4 + k_6 \cdot X_3 + k_9 \cdot X_2 \\
Y_3 &= k_1 \cdot X_5 + k_4 \cdot X_4 + k_7 \cdot X_3 + k_{10} \cdot X_2 \\
Y_4 &= k_2 \cdot X_5 + k_5 \cdot X_4 + k_8 \cdot X_3 + k_{11} \cdot X_2 \\
Y_5 &= k_0 \cdot X_6 + k_3 \cdot X_5 + k_6 \cdot X_4 + k_9 \cdot X_3 \\
Y_6 &= k_1 \cdot X_6 + k_4 \cdot X_5 + k_7 \cdot X_4 + k_{10} \cdot X_3 \\
Y_7 &= k_2 \cdot X_6 + k_5 \cdot X_5 + k_8 \cdot X_4 + k_{11} \cdot X_3 \\
Y_8 &= k_0 \cdot X_7 + k_3 \cdot X_6 + k_6 \cdot X_5 + k_9 \cdot X_6 \\
Y_9 &= k_1 \cdot X_7 + k_4 \cdot X_6 + k_7 \cdot X_5 + k_{10} \cdot X_5 \\
Y_{10} &= k_2 \cdot X_7 + k_5 \cdot X_6 + k_8 \cdot X_5 + k_{11} \cdot X_6 \\
Y_{11} &= k_0 \cdot X_8 + k_3 \cdot X_7 + k_6 \cdot X_6 + k_9 \cdot X_5 \\
Y_{12} &= k_1 \cdot X_8 + k_4 \cdot X_7 + k_7 \cdot X_6 + k_{10} \cdot X_6 \\
Y_{13} &= k_2 \cdot X_8 + k_5 \cdot X_7 + k_8 \cdot X_6 + k_{11} \cdot X_5 \\
Y_{14} &= k_0 \cdot X_9 + k_3 \cdot X_8 + k_6 \cdot X_7 + k_9 \cdot X_6
\end{aligned} \tag{2}$$

By taking out data at a clock rate of 13.5 MHz as shown at E of FIG. 1 from data $\{Y_n\}$ of a clock rate of 54 MHz as shown at D of FIG. 1 and D of FIG. 2 thus obtained, output data having a clock rate of 13.5 MHz which has maintained the frequency characteristic of input data $\{X_n\}$ at its maximum can be obtained as shown at E of FIG. 2.

On the other hand, in the up-rate converter, input data having a clock rate of 13.5 MHz is converted to output data having a clock rate of 18 MHz by a filtering processing as shown in FIGS. 3 and 4.

Namely, also in the up-rate converter, 0 data are inserted into the portions which can be sampling points of 18 MHz as shown at B of FIG. 3 with respect to input data $\{X_n\}$ of a clock rate of 13.5 MHz as shown at A of FIG. 3 to up-convert the clock rate of the input data $\{X_n\}$ so as to become equal to a frequency of the least common multiple of 13.5 MHz and 18 MHz, i.e., a clock rate of 54 MHz. Thus, in the frequency region, frequency components which have repeated with a frequency of 13.5 MHz being as a unit as indicated at A of FIG. 4 change into frequency components repeating with a frequency of 54 MHz being as a unit while the frequency characteristic is as it is as shown at B of FIG. 4.

A filter of a characteristic as shown at C of FIG. 3 and C of FIG. 4 is applied to the data of the clock rate of 54 MHz. Namely, since the output clock rate is 18 MHz, if there is any frequency component more than 9 MHz which is one half of 18 MHz in the frequency range up to 27 MHz which is one half of 54 MHz, any arising frequency component might take place by the sampling theorem when the clock rate is caused to be a clock rate of 18 MHz, failing to maintain the original frequency characteristic. For this reason, a low-pass filter for suppressing frequency components more than 9 MHz is applied.

Here, data $\{Y_n\}$ having a clock rate of 54 MHz which has suppressed the frequency components more than 9 MHz is subjected to a filtering processing of a transfer function $F_2(z)$ indicated by the following formula (3) where, e.g., the number of taps is set to 12 in a digital filter operative at 54 MHz with respect to input data $X_n = z_n \cdot X_1$.

$$F_2(z) = \sum_{i=0}^{11} K \cdot z^{-i} \tag{3}$$

By implementing the filtering processing of the transfer function $F_2(z)$ as indicated by the above-mentioned formula (3) to data $\{Y_n\}$, data $Y_1 \sim Y_{14}$ as indicated by the following formula (4) are provided.

$$Y_1 = k_3 \cdot X_3 + k_7 \cdot X_2 + k_{11} \cdot X_1$$

$$Y_2 = k_0 \cdot X_4 + k_4 \cdot X_3 + k_8 \cdot X_2$$

$$Y_3 = k_1 \cdot X_4 + k_5 \cdot X_3 + k_9 \cdot X_2$$

$$Y_4 = k_2 \cdot X_4 + k_6 \cdot X_3 + k_{10} \cdot X_2$$

$$Y_5 = k_3 \cdot X_4 + k_7 \cdot X_3 + k_{11} \cdot X_2$$

$$Y_6 = k_0 \cdot X_5 + k_4 \cdot X_4 + k_8 \cdot X_3$$

$$Y_7 = k_1 \cdot X_5 + k_5 \cdot X_4 + k_9 \cdot X_3 \tag{4}$$

$$Y_8 = k_2 \cdot X_5 + k_6 \cdot X_4 + k_{10} \cdot X_3$$

$$Y_9 = k_3 \cdot X_5 + k_7 \cdot X_4 + k_{11} \cdot X_3$$

$$Y_{10} = k_0 \cdot X_6 + k_4 \cdot X_5 + k_8 \cdot X_4$$

$$Y_{11} = k_1 \cdot X_6 + k_5 \cdot X_5 + k_9 \cdot X_4$$

$$Y_{12} = k_2 \cdot X_6 + k_6 \cdot X_5 + k_{10} \cdot X_4$$

$$Y_{13} = k_3 \cdot X_6 + k_7 \cdot X_5 + k_{11} \cdot X_4$$

$$Y_{14} = k_0 \cdot X_7 + k_4 \cdot X_6 + k_8 \cdot X_5$$

By taking out data at a clock rate of 18 MHz as shown at E of FIG. 3 from the data $\{Y_n\}$ of the clock rate of 54 MHz as shown at D of FIG. 3 and D of FIG. 4 thus obtained, output data of a clock rate of 18 MHz which has maintained the frequency characteristic of input data $\{X_n\}$ at its maximum can be provided as shown at E of FIG. 4.

Meanwhile, as described above, the conventional rate converter requires an operational processing unit operative at a high speed for implementing a filtering processing at a clock rate of the least common multiple of an input clock and an output clock to input data.

Here, in a down-rate converter for converting input data of a clock rate of 18 MHz to output data of a clock rate of 13.5 MHz, data $\{Y_n\}$ of a clock rate of 54 MHz which is the least common multiple of the input clock rate of 13.5 MHz and the output clock rate of 18 MHz obtained by the filtering processing of the transfer function $F_1(z)$ indicated by the above-described formula (1) can be classified into three sets every coefficient.

The first set is comprised of data $\{Y_{3n-1}\}$ having coefficients $\{k_0, k_3, k_6, k_9\}$ indicated by the following formula (5):

$$Y_2 = k_0 \cdot X_5 + k_3 \cdot X_4 + k_6 \cdot X_3 + k_9 \cdot X_2$$

$$Y_5 = k_0 \cdot X_6 + k_3 \cdot X_5 + k_6 \cdot X_4 + k_9 \cdot X_3$$

$$Y_8 = k_0 \cdot X_7 + k_3 \cdot X_6 + k_6 \cdot X_5 + k_9 \cdot X_6 \tag{5}$$

$$Y_{11} 32 \; k_0 \cdot X_8 + k_3 \cdot X_7 + k_6 \cdot X_6 + k_9 \cdot X_5$$

$$Y_{14} = k_0 \cdot X_9 + k_3 \cdot X_8 + k_6 \cdot X_7 + k_9 \cdot X_6$$

The second set is comprised of data $\{Y_{3n}\}$ having coefficients $\{k_1, k_4, k_7, k_{10}\}$ indicated by the following formula (6):

$$Y_3 = k_1 \cdot X_5 + k_4 \cdot X_4 + k_7 \cdot X_3 + k_{10} \cdot X_2$$

$$Y_6 = k_1 \cdot X_6 + k_4 \cdot X_5 + k_7 \cdot X_4 + k_{10} \cdot X_3$$

$$Y_9 = k_1 \cdot X_7 + k_4 \cdot X_6 + k_7 \cdot X_5 + k_{10} \cdot X_5 \tag{6}$$

$$Y_{12} = k_1 \cdot X_8 + k_4 \cdot X_7 + k_7 \cdot X_6 + k_{10} \cdot X_6$$

The third set is comprised of data $\{Y_{3n-2}\}$ having coefficients $\{k_2, k_5, k_8, k_{11}\}$ indicated by the following formula (7):

$$Y_1 = k_2 \cdot X_4 + k_5 \cdot X_3 + k_8 \cdot X_2 + k_{11} \cdot X_1$$

$$Y_4 = k_2 \cdot X_5 + k_5 \cdot X_4 + k_8 \cdot X_3 + k_{11} \cdot X_2$$

$$Y_7 = k_2 \cdot X_6 + k_5 \cdot X_5 + k_8 \cdot X_4 + k_{11} \cdot X_3 \tag{7}$$

$$Y_{10} = k_2 \cdot X_7 + k_5 \cdot X_6 + k_8 \cdot X_5 + k_{11} \cdot X_6$$

$$Y_{13} = k_2 \cdot X_8 + k_5 \cdot X_7 + k_8 \cdot X_6 + k_{11} \cdot X_5$$

The data $\{Y_{3n-1}\} = 56$ having the first set of coefficients $\{k_0, k_3, k_6, k_9\}$ can be obtained by a digital filter of a transfer function $Fa(z)$ indicated by the following formula (8):

$$Fa(z) = k_0 + k_3 \cdot z^{-1} + k_6 \cdot z^{-2} + k_9 \cdot z^{-3} \tag{8}$$

Further, the data $\{Y_{3n}\}$ having the second set of coefficients $\{k_1, k_4, k_7, k_{10}\}$ can be obtained by a digital filter of a transfer function $Fb(z)$ indicated by the following formula (9):

$$Fb(z) = k_1 + k_4 \cdot z^{-1} + k_7 \cdot z^{-2} + k_{10} \cdot z^{-3} \tag{9}$$

In addition, the data $\{Y_{3n-2}\}$ having the third set of coefficients $\{k_2, k_5, k_8, k_{11}\}$ can be obtained by a digital filter of a transfer function $Fc(z)$ indicated by the following formula (10):

$$Fc(Z) = k_2 + k_5 \cdot z^{-1} + k_8 \cdot z^{-2} + k_{11} \cdot z^{-3} \tag{10}$$

Accordingly, in the down-rate converter, in place of inserting 0 data with respect to input data of a clock rate of 18 MHz to up-convert the clock rate so as to become equal to 54 MHz which is the least common multiple, three digital filters for carrying out filtering processing of respective transfer functions $Fa(z)$, $Fb(z)$ and $Fc(z)$ indicated by the above-mentioned formulas (8), (9) and (10) are caused to be operative in parallel at 18 MHz of the input clock rate, thereby making it possible to calculate the data $\{Y_n\}$.

Similarly, in an up-rate converter for converting input data of a clock rate of 13.5 MHz to output data of a clock rate of 18 MHz, data $\{Y_n\}$ of a clock rate of 54 MHz which is the least common multiple of the input clock rate of 13.5 MHz and the output clock rate of 18 MHz obtained by the filtering processing of the transfer function $F_2(z)$ indicated by the above-mentioned formula (3) can be classified into four sets of data $\{Y_{4n-2}\}$ having the first set of coefficients $\{K_0, K_4, K_8\}$, data $\{Y_{4n-1}\}$ having the second set of coefficients $\{K_1, K_5, K_9\}$, data $\{Y_{4n}\}$ having the third set of coefficients $\{K_2, K_6, K_{10}\}$, and data $\{Y_{4n-3}\}$ having the fourth set of coefficients $\{K_3, K_7, K_{11}\}$. In place of inserting 0 data with respect to input data of the clock rate of 13.5 MHz to up-convert the clock rate so as to become equal to 54 MHz which is the least common multiple, four digital filters for carrying out filtering processing of respective transfer functions Fa(z), Fb(z), Fc(z), Fd(z) indicated by the following formulas (11), (12), (13), (14) are caused to be operative in parallel at 13.5 MHz of the input clock rate, thereby making it possible to calculate the data $\{Y_n\}$.

$$Fa(z)=k_0+k_4 \cdot z^{-1}+k_8 \cdot z^{-2} \qquad (11)$$

$$Fb(z)=k_1+k_5 \cdot z^{-1}+k_8 \cdot z^{-2} \qquad (12)$$

$$Fc(z)=k_2+k_6 \cdot z^{-1}+k_{10} \cdot z^{-2} \qquad (13)$$

$$Fd(z)=k_3+k_7 \cdot z^{-1}+k_{11} \cdot z^{-2} \qquad (14)$$

As described above, a plurality of digital filters are caused to be operative in parallel at an input clock rate, thereby allowing a digital filter operative at a high speed at a clock rate of the least common multiple of the input clock rate and the output clock rate to become unnecessary. However, such a plurality of digital filters are required.

SUMMARY OF THE INVENTION

In view of actual circumstances of a conventional rate converter as described above, an object of this invention is to provide a rate converter capable of converting a rate by a single digital filter without necessity of digital filters operative at a high speed at a clock rate which is the least common multiple of an input clock rate and an output clock rate.

As described above, in principle, the rate converter is constructed to up-convert input data so that the clock rate becomes equal to a clock rate of the least common multiple of an input clock rate and an output clock rate to implement thinning processing thereto by using a filter to thereby obtain output data of a target output clock Fate. For this reason, there is no necessity of calculating data except for the output data of the output clock rate. Accordingly, if filtering processing is carried out at an output clock rate to obtain output data of the output clock rate, the rate can be converted by a single digital filter operative at the output clock rate without necessity of a digital filter operative at a high speed at a clock rate of the least common multiple of the input clock rate and the output clock rate.

For example, in a down-rate converter for converting input data of a clock rate of 18 MHz to output data of a clock rate of 13.5 MHz, data set $\{Y_{4n}\}$, $\{Y_{4n+1}\}$, $\{Y_{4n+2}\}$ or $\{Y_{4n+3}\}$ taken out at a clock rate of 13.5 MHz from data $\{Y_n\}$ of a clock rate of 54 MHz of the least common multiple of an input clock rate and an output clock rate, which is obtained by up-converting input data of the clock rate of 18 MHz, is caused to be output data in principle. For example, in the case where data set $\{Y_{4n}\}$ is assumed to be output data, respective data are expressed by the following formula (15).

$$Y_0=k_1 \cdot X_4+k_4 \cdot X_3+k_7 \cdot X_2+k_{10} \cdot X_1$$

$$Y_4=k_2 \cdot X_5+k_5 \cdot X_4+k_8 \cdot X_3+k_{11} \cdot X_2$$

$$Y_8=k_0 \cdot X_6+k_3 \cdot X_6+k_6 \cdot X_5+k_9 \cdot X_4 \qquad (15)$$

$$Y_{12}=k_1 \cdot X_8+k_4 \cdot X_7+k_7 \cdot X_6+k_{10} \cdot X_5$$

$$Y_{16}=k_2 \cdot X_9+k_5 \cdot X_8+k_8 \cdot X_7+k_{11} \cdot X_6$$

$$Y_{20}=K_0 \cdot X_{11}+k_3 \cdot X_{10}+k_6 \cdot X_9+k_9 \cdot X_8$$

Accordingly, it is sufficient to sequentially select outputs of three digital filters for carrying out filtering processing of the respective transfer functions Fa(z), Fb(z), Fc(z) indicated by the above-mentioned formulas (8), (9), (10) by the above-described first to third Sets of coefficients. By sequentially switching the first to third sets of coefficients at 13.5 MHz of the output clock rate while latching input data at 18 MHz of the input clock rate to cause a single digital filter to be operative, output data $\{Y_{4n}\}$ can be provided.

Similarly, in an up-rate converter for converting input data of a clock rate of 13.5 MHz to output data of a clock rate of 18 MHz, data set $\{Y_{3n}\}$, $\{Y_{3n+1}\}$ or $\{Y_{3n+2}\}$ taken out at the clock rate of 18 MHz is assumed to be output data. For example, in the case where data set $\{Y_{3n+1}\}$ is assumed to be output data, respective data are indicated by the following formula (16):

$$Y_1=k_3 \cdot X_3+k_7 \cdot X_2+k_{11} \cdot X_1$$

$$Y_4=k_2 \cdot X_4+k_6 \cdot X_3+k_{10} \cdot X_2$$

$$Y_7=k_1 \cdot X_5+k_5 \cdot X_4+k_9 \cdot X_3$$

$$Y_{10}=k_0 \cdot X_6+k_4 \cdot X_5+k_8 \cdot X_4$$

$$Y_{13}=k_3 \cdot X_6+k_7 \cdot X_5+k_{11} \cdot X_4 \qquad (16)$$

$$Y_{16}=k_2 \cdot X_7+k_6 \cdot X_6+k_{10} \cdot X_5$$

$$Y_{19}=k_1 \cdot X_8+k_5 \cdot X_7+k_9 \cdot X_6$$

$$Y_{22}=k_0 \cdot X_9+k_4 \cdot X_8+k_8 \cdot X_7$$

$$Y_{25}=k_3 \cdot X_9+k_7 \cdot X_8+k_{11} \cdot X_7$$

$$Y_{28}=k_2 \cdot X_{10}+k_6 \cdot X_9+k_{10} \cdot X_8$$

Accordingly, it is sufficient to sequentially select outputs of four digital filters for carrying out a filtering processing of respective transfer functions Fa(z), Fb(z), Fc(z), Fd(z) indicated by the above-mentioned formulas (11), (12), (13), (14). By sequentially switching the first to third sets of coefficients at 18 MHz of the output clock rate while latching input data at 13.5 MHz of the input clock rate to cause a single digital filter to be operative, output data $\{Y_{3n}\}$ can be provided.

This invention contemplates attaining the above-described object by applying such a concept to a practical rate converter for converting data rate of an input signal.

Namely, in accordance with this invention, there is provided, in a broad sense of the above-mentioned concept, a rate converter for converting data rate of an input signal, comprising: shift-register means having a plurality of output stages, and adapted for sequentially shifting the input signal at an input clock rate of the input signal; latch means connected to the output stages, and adapted for holding signals from the output stages and outputting the held signals at an output clock rate different from the input clock rate; coefficient generating means for generating filter coefficients at the output clock rate; multiplier means for multiplying the held signals from the latch means by the filter coefficients from the coefficient generating means, respectively; and adding means for adding output signals from the multiplier means to output a rate converted signal.

The latch means may comprise first latch means for holding signals from the output stages by an output clock at the output clock rate; second latch means for holding signals from the output stages by an inverted output clock at the output clock rate; switch means for selectively outputting held signals from the first and second latch means; and third latch means for holding signals from the switch means by the output clock.

The latch means may comprise switch means for selectively outputting an output clock at the output clock rate and an inverted output clock at the output clock rate; first latch means for holding signals from the output stages by the output clock or the inverted output clock outputted from the switch means; and second latch means for holding held signals from the first latch means by the output clock.

The latch means may comprise latch clock generating means for generating a latch clock signal at the output clock rate, first latch means for holding signals from the output stages by the latch clock signal; and second latch means for holding held signals from the first latch means by an output clock at the output clock rate.

The input signal and the rate converted signal are, e.g., a digital video signal subjected to transmission/reception between digital circuits operative at two different clock rates.

In a more practical sense of the above-mentioned concept, there is provided a down-rate converter for down-converting data rate of an input signal, comprising: a three stage shift-register having four output stages, and adapted for sequentially shifting the input signal at an input clock rate of the input signal; four latches connected to the output stages, and adapted for holding signals from the output stages and outputting the held signals at an output clock rate different from the input clock rate; four coefficient generators for generating filter coefficients in a predetermined order at the output clock rate; four multipliers for multiplying the held signals from the latch means by the filter coefficients from the coefficient generating means, respectively; and an adder for adding output signals from the multiplier means to output a down-rate converted signal.

In another more practical sense of the above-mentioned concept, there is further provided an up-rate converter for up-converting data rate of an input signal, comprising: a two-stage shift-register having three output stages, and adapted for sequentially shifting the input signal at an input clock rate of the input signal; three latches connected to the output stages, and adapted for holding signals from the output stages and outputting the held signals at an output clock rate different from the input clock rate; three coefficient generators for generating filter coefficients in a predetermined order at the output clock rate; three multipliers for multiplying the held signals from the latch means by the filter coefficients from the coefficient generating means, respectively; and an adder for adding output signals from the multiplier means to output an up-rate converted signal.

Since the rate converter for converting data rate of an input signal according to this invention is constructed as above, such rate converter operates as follows. Namely, an input signal is sequentially shifted at an input clock rate of the input signal by the shift-register means to hold, by the latch means, signals from the output stages of the shift-register means to output the held signals at an output clock rate different from the input clock rate to respectively multiply the held signals from the latch means by filter coefficients from coefficient generating means to add output signals from the multiplier means thus to output a rate converted signal.

In the preferred embodiment, signals from the output stages of the shift-register means are held in parallel by an output clock and its inverted output clock at an output clock rate by using first and second latch-means to hold again held signals selectively outputted from the switch means by using the third latch means.

In the further preferred embodiment, an output clock at the output clock rate and an inverted output clock at the output clock rate are selectively outputted from the switching means to hold signals from the output stages of the shift-register means by the output clock or the inverted output clock from the switch means to hold again held signals from the first latch means by the output clock by using the second latch means.

In the still further preferred embodiment, signals from the output stages of the shift-register means are held by a latch clock signal generated from the latch clock generating means by using the first latch means to hold again held signals from the first latch means by an output clock at the output clock rate by using the second latch means.

Further, in accordance with the down-rate converter according to this invention, signals from the output stages of the three-stage shift register are held at an output clock rate by the four latches to multiply the held signals from the four latches by respective filter coefficients that the four coefficient generators generates in a predetermined order by using four multipliers to add multiplied outputs by using the adder, thereby providing a down-rate converted signal.

In addition, in accordance with the up-rate converter according to this invention, signals from the output stages of the two-state shift register are held at an output clock rate by the three latches to multiply the held signals from the three latches by filter coefficients that three coefficient generators generate in a predetermined order by using the three multipliers to add multiplied outputs by using the adder, thereby providing an up-rate converted signal.

Other objects of this invention and advantages obtained with this invention will become more clear from the preferred embodiments which will be described with reference to the attached drawings.

DETAILED DESCRIPTION OF THE PREFERRED EMBODIMENTS

Preferred embodiments of a rate converter according to this invention will now be described in detail with reference to the attached drawings.

Figure 1A:
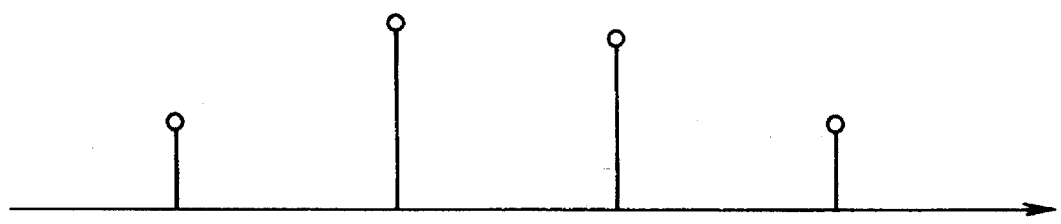
FIGS. 1A–1E is a view showing the principle of operation of a conventional down-rate converter on the time base.
Figure 1B:
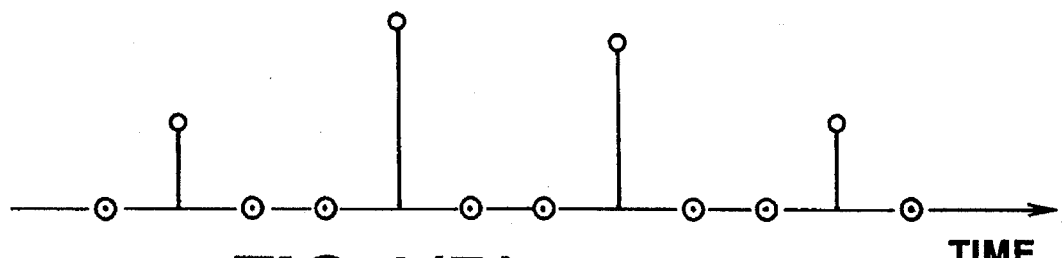
Figure 1C:
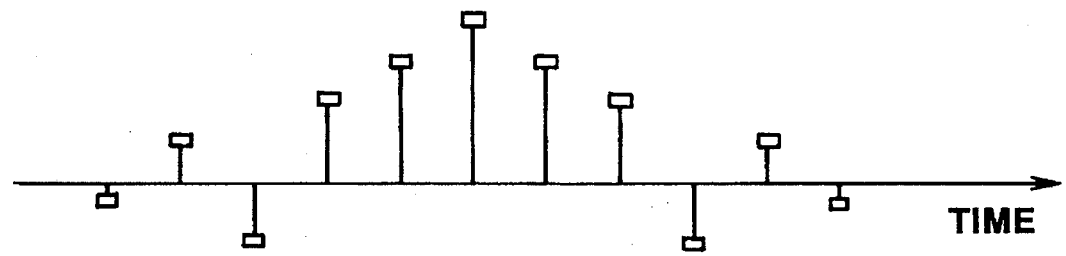
Figure 1D:
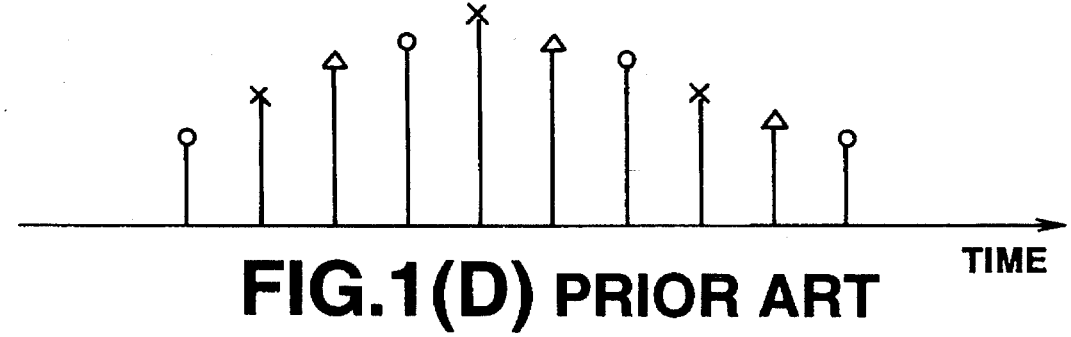
Figure 1E:
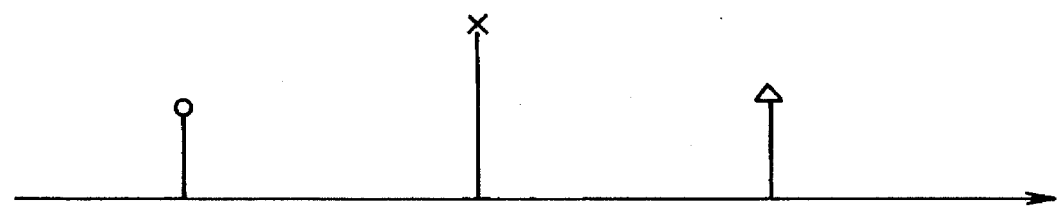
Figure 2A:
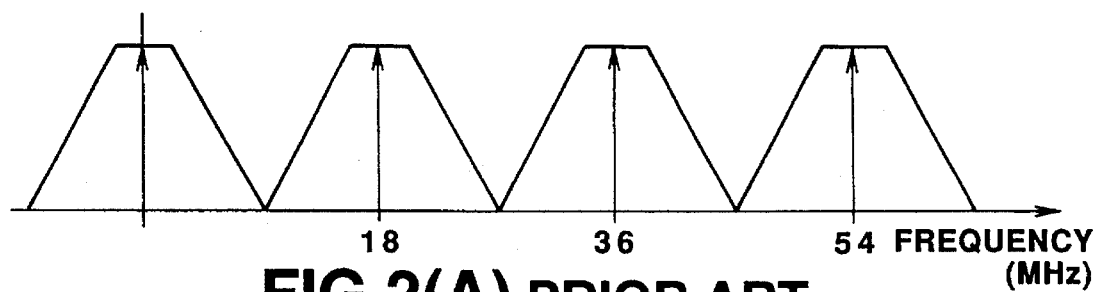
FIGS. 2A–2E is a view showing the principle of operation of the conventional down-rate converter on the frequency base.
Figure 2B:
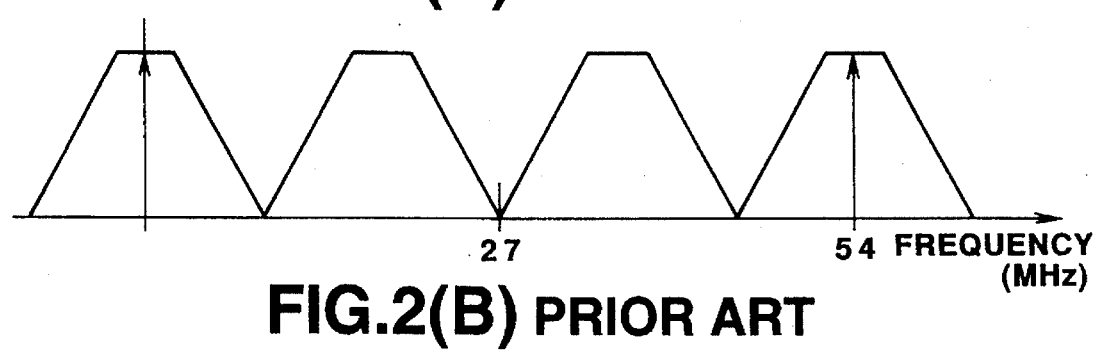
Figure 2C:
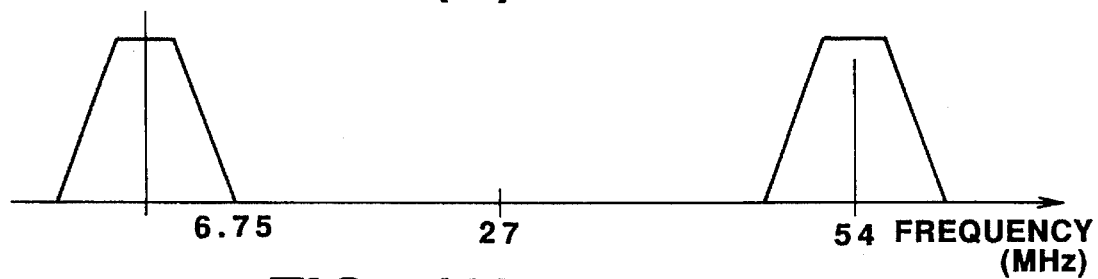
Figure 2D:
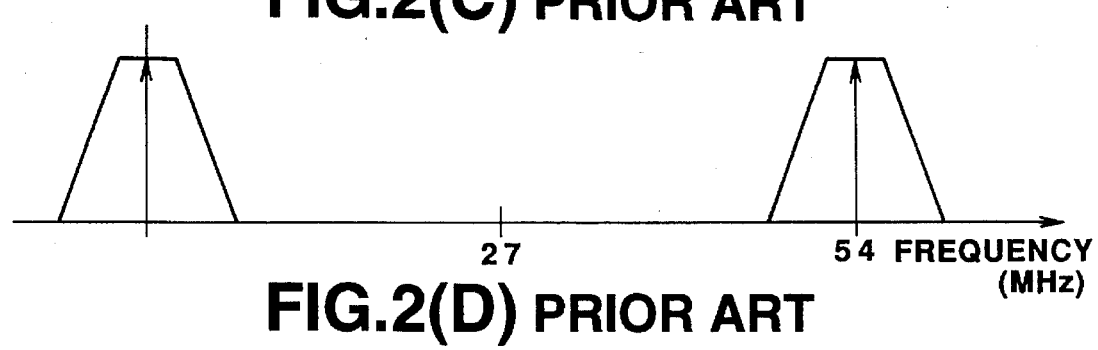
Figure 2E:
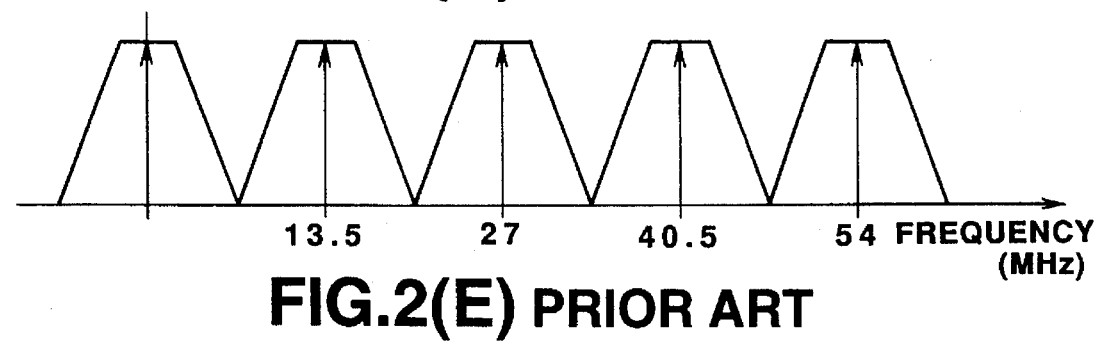
Figure 3A:
FIGS. 3A–3E is a view showing the principle of operation of a conventional up-rate converter on the time base.
Figure 3B:
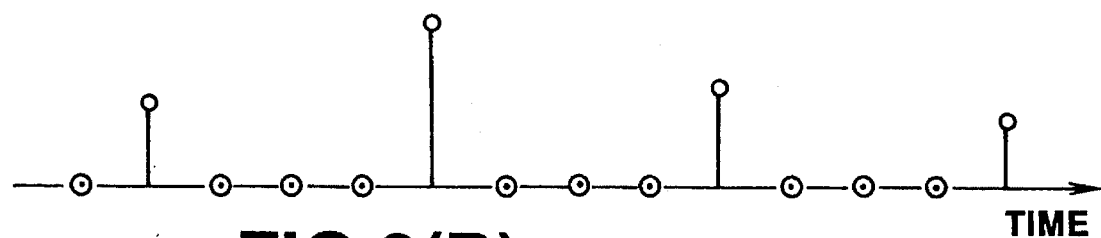
Figure 3C:
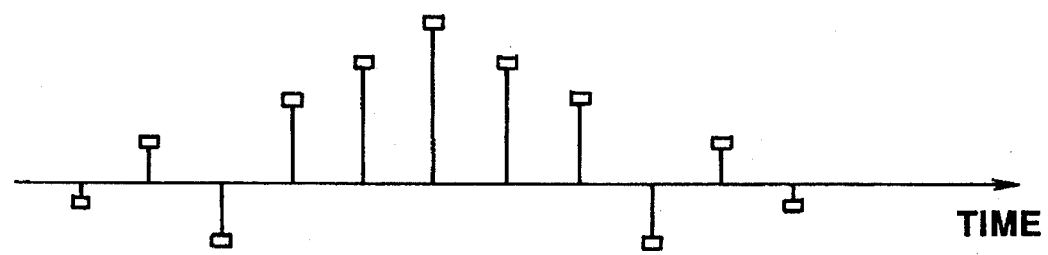
Figure 3D:
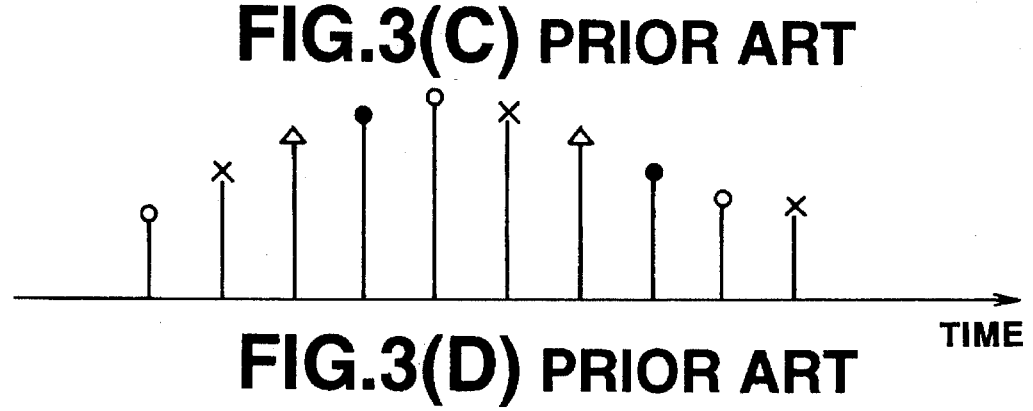
Figure 3E:
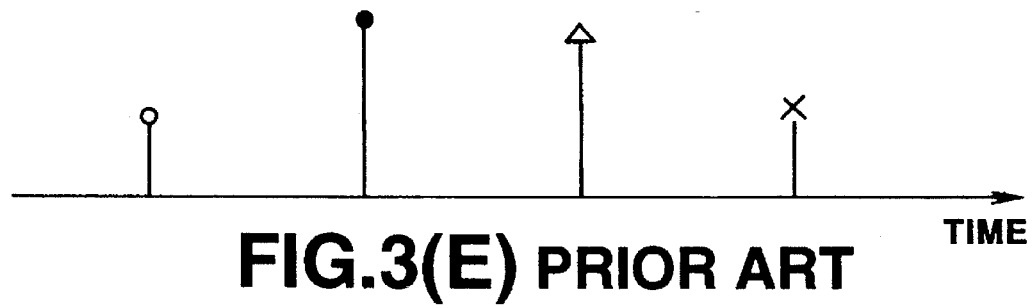
Figure 4A:
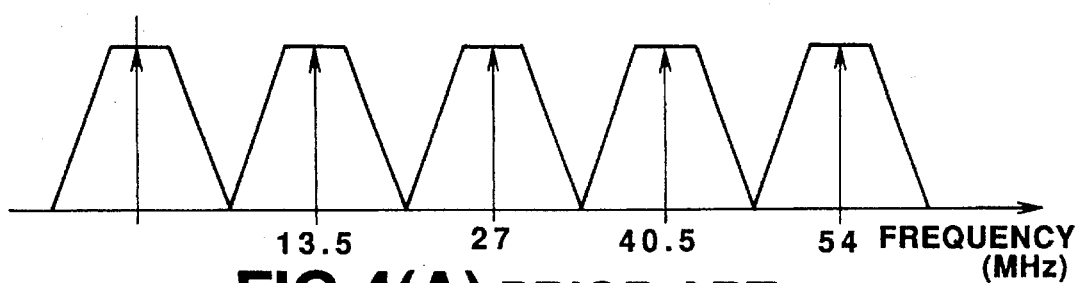
FIGS. 4A–4E is a view showing the principle of operation of the conventional up-rate converter on the frequency base.
Figure 4B:
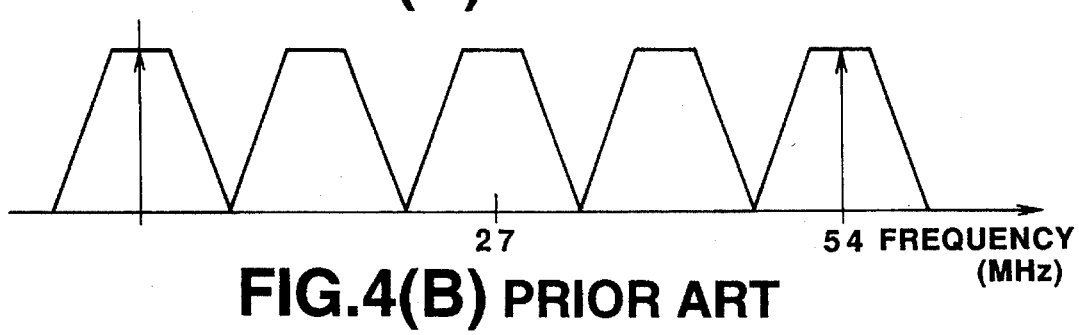
Figure 4C:
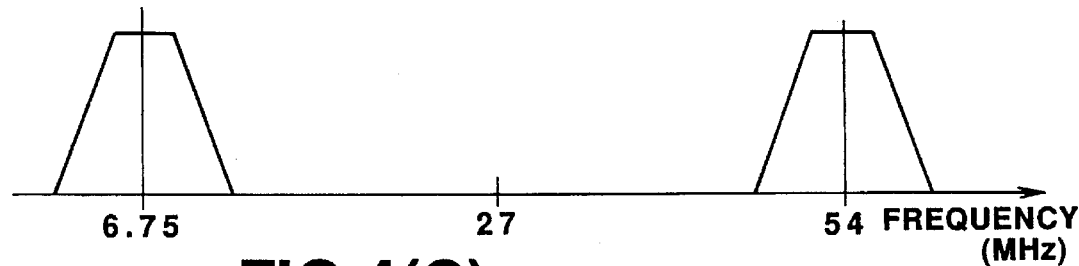
Figure 4D:
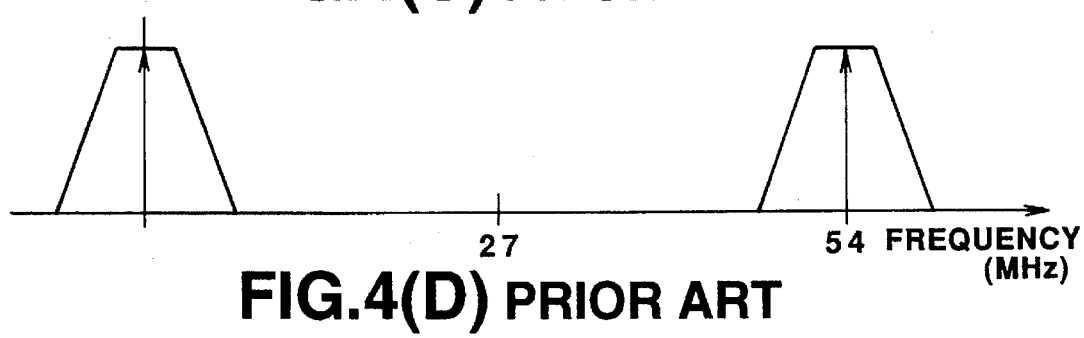
Figure 4E:
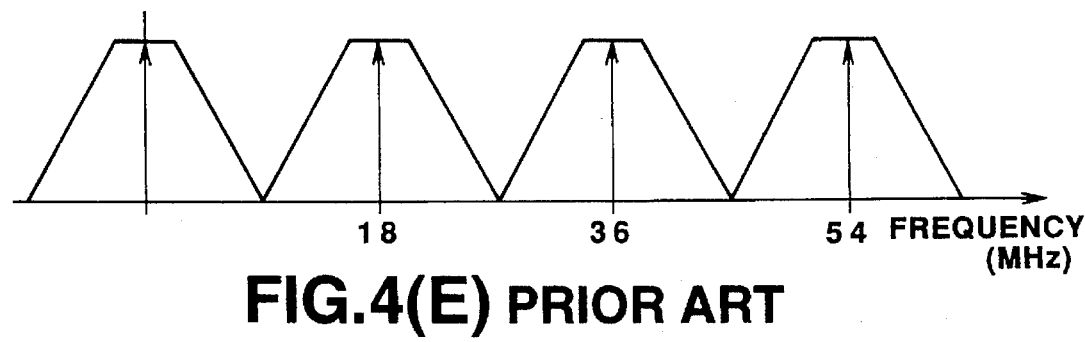
Figure 5:
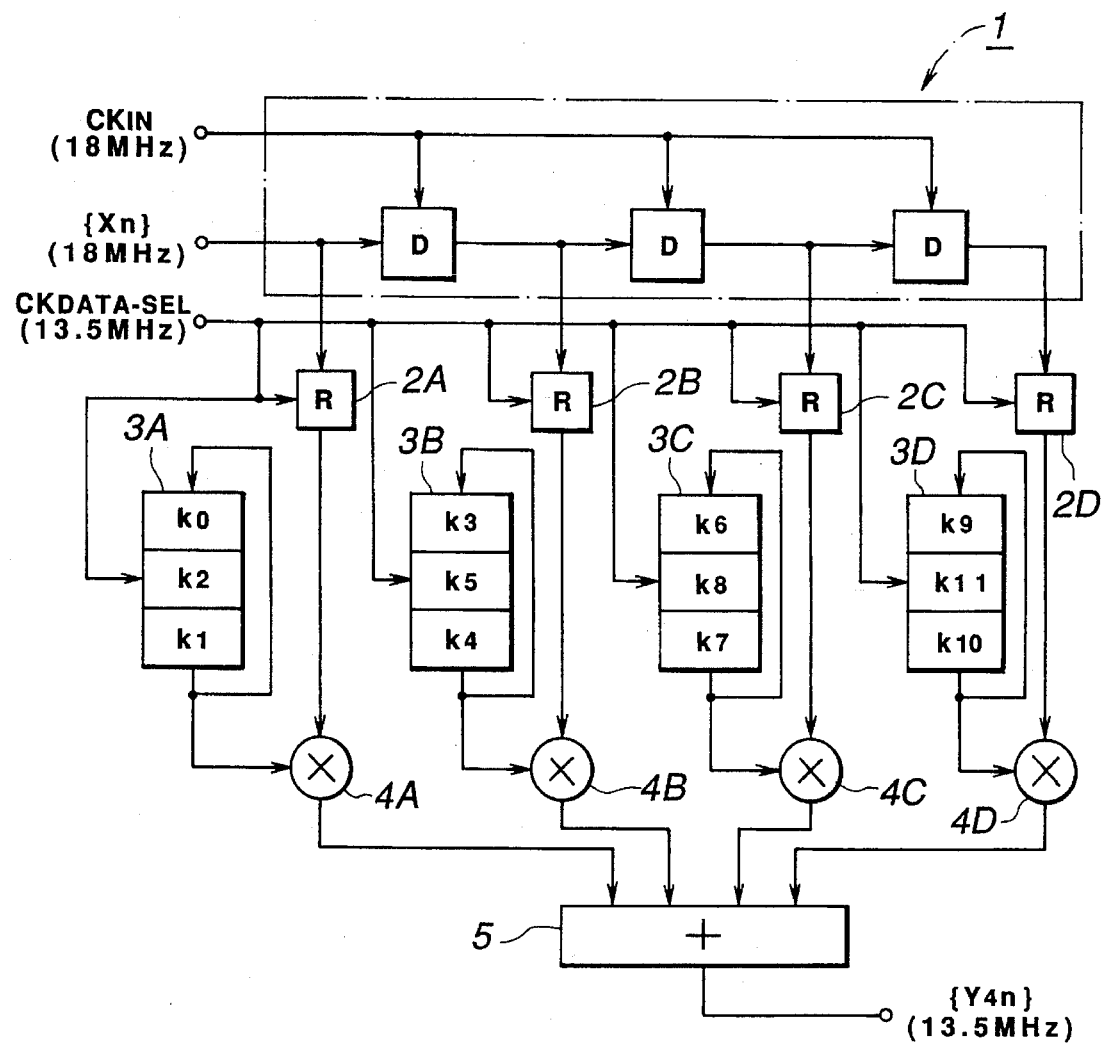
FIG. 5 is a block diagram showing the configuration of a down-rate converter according to this invention.

A rate converter according to this invention is constituted as shown in FIG. 5, for example.

The rate converter shown in FIG. 5 is directed to the embodiment of a down-rate converter for converting an input signal (input data $\{X_n\}$) of a clock rate of 18 MHz to an output signal (output data) of a clock rate of 13.5 MHz. The down-rate converter comprises a three stage shift-register 1 having four output stages, and adapted for sequentially shifting the input signal (i.e., data contents of the input data) at the input clock rate of 18 MHz; four latches 2A, 2B, 2C, 2D connected to the output stages of the shift register 1, and adapted for holding signals (data contents) from the output stages and outputting held signals at the output clock rate of 13.5 MHz; four coefficient generators 3A, 3B, 3C, 3D for generating filter coefficients at the output clock rate of 13.5 MHz; four multipliers 4A, 4B, 4C, 4D for multiplying the held signals from the latches by the filter coefficients from the coefficient generators 3A, 3B, 3C, 3D, respectively; and an adder 5 for adding output signals from the multipliers 4A–4D to output a down-rate converted signal.

It should be noted that input data will imply contents of input data (input signal) and output data will imply contents of output data (output signal) depending upon the circumstances.

In the rate converter of this embodiment, input data $\{X_n\}$ of the clock rate of 18 MHz is delivered to the shift register 1. This shift register 1 become operative at the input clock rate of 18 MHz by a clock $CK_{IN}$ to sequentially shift data contents of input data $\{X_n\}$. Respective data contents from the output stages of shift registers 1 are delivered to the four latch circuits 2A, 2B, 2C and 2D. In this instance, input data $\{X_n\}$ is directly delivered to the first latch circuit 2A of the four latch circuits 2A, 2B, 2C and 2D, input data $\{X_n\}$ shifted (delayed) by one clock is delivered to the second latch circuit 2B, input data $\{X_n\}$ shifted (delayed) by two clocks is delivered to the third latch circuit 2C, and input data $\{X_n\}$ shifted (delayed) by three clocks is delivered to the fourth latch circuit 2D.

These four latch circuits 2A, 2B, 2C and 2D are operated at the output clock rate of 13.5 MHz by a data select latch clock $CK_{DATA-SEL}$ to latch (hold) data contents of the input data $\{X_n\}$ sequentially shifted (delayed) by the three stage shift register 1 (i.e., signals from the respective output stages of the shift register 1). Respective latch outputs of the latch circuits 2B, 2C and 2D (i.e., held signals outputted therefrom) are delivered to the four multipliers 4A, 4B, 4C and 4D. In this case, a latch output from the first latch circuit 2A is delivered to the first multiplier 4A of the four multipliers 4A, 4B, 4C and 4D, a latch output from the second latch circuit 2B is delivered to the second multiplier 4B, a latch output from the third latch circuit 2C is delivered to the third multiplier 4C, and a latch output from the fourth latch circuit 2D is delivered to the fourth multiplier 4D.

The four coefficient generators 3A, 3B, 3C and 3D sequentially output filter coefficients $K_i$ in the transfer function $F_1(z)$ indicated by the previously mentioned formula (1) at the output clock rate of 13.5 MHz in parallel three by three. Namely, the first coefficient generator 3A of the four coefficient generators 3A, 3B, 3C and 3D repeatedly generate filter coefficients $K_1$, $K_2$, $K_0$. These filter coefficients $K_1$, $K_2$, $K_0$ generated by the first coefficient generator 3A are sequentially delivered to the first multiplier 4A at the output clock rate of 13.5 MHz. The second coefficient generator 3B repeatedly generates filter coefficients $K_4$, $K_5$, $K_3$. These filter coefficients $K_4$, $K_5$, $K_3$ generated by the second coefficient generator 3B are sequentially delivered to the second multiplier 4B at the output clock rate of 13.5 MHz. The third coefficient generator 3C repeatedly generate filter coefficients $K_7$, $K_8$, $K_6$. These filter coefficients $K_7$, $K_8$, $K_6$ generated by the third coefficient generator 3C are sequentially delivered to the third multiplier 4C at the output clock rate of 13.5 MHz. In addition, the fourth coefficient generator 3D repeatedly generates filter coefficients $K_{10}$, $K_{11}$, $K_9$. These filter coefficients $K_{10}$, $K_{11}$, $K_9$ generated by the fourth coefficient generator 3D are sequentially delivered to the fourth multiplier 4D at the output clock rate of 13.5 MHz.

Further, these four multipliers 4A, 4B, 4C and 4D sequentially carry out, at the output clock rate of 13.5 MHz, a multiplicative processing for multiplying in parallel respective held signals from the four latch circuits 2A, 2B, 2C and 2D by coefficients $K_i$ by the four coefficient generators 3A, 3B, 3C and 3D. Respective multiplied outputs by these multipliers 4A, 4B, 4C and 4D are delivered to the adder 15.

The adder 15 adds respective multiplied outputs by the multipliers 4A, 4B, 4C and 4D to thereby sequentially output data $\{Y_n\}$ (down-rate converted signals) as indicated by the following formula (17), of the output clock rate of 13.5 MHz obtained by down-rate converting input data $\{X_n\}$ of the input clock rate of 18 MHz.

$$Y_0 = k_1 \cdot K_4 + k_4 \cdot X_3 + k_7 \cdot X_2 + k_{10} \cdot X_1$$

$$Y_4 = k_2 \cdot X_5 + k_5 \cdot X_4 + k_8 \cdot X_3 + k_{11} \cdot X_2$$

$$Y_8 = k_0 \cdot X_6 + k_3 \cdot X_6 + k_6 \cdot X_5 + k_9 \cdot X_4$$

$$Y_{12} = k_1 \cdot X_8 + k_4 \cdot X_7 + k_7 \cdot X_6 + k_{10} \cdot X_5 \qquad (17)$$

$$Y_{16} = K_2 \cdot X_9 + k_5 \cdot X_8 + k_8 \cdot X_7 + k_{11} \cdot X_6$$

$$Y_{20} = k_0 \cdot X_{11} + k_3 \cdot X_{10} + k_6 \cdot X_9 + k_9 \cdot X_8$$

Figure 6:
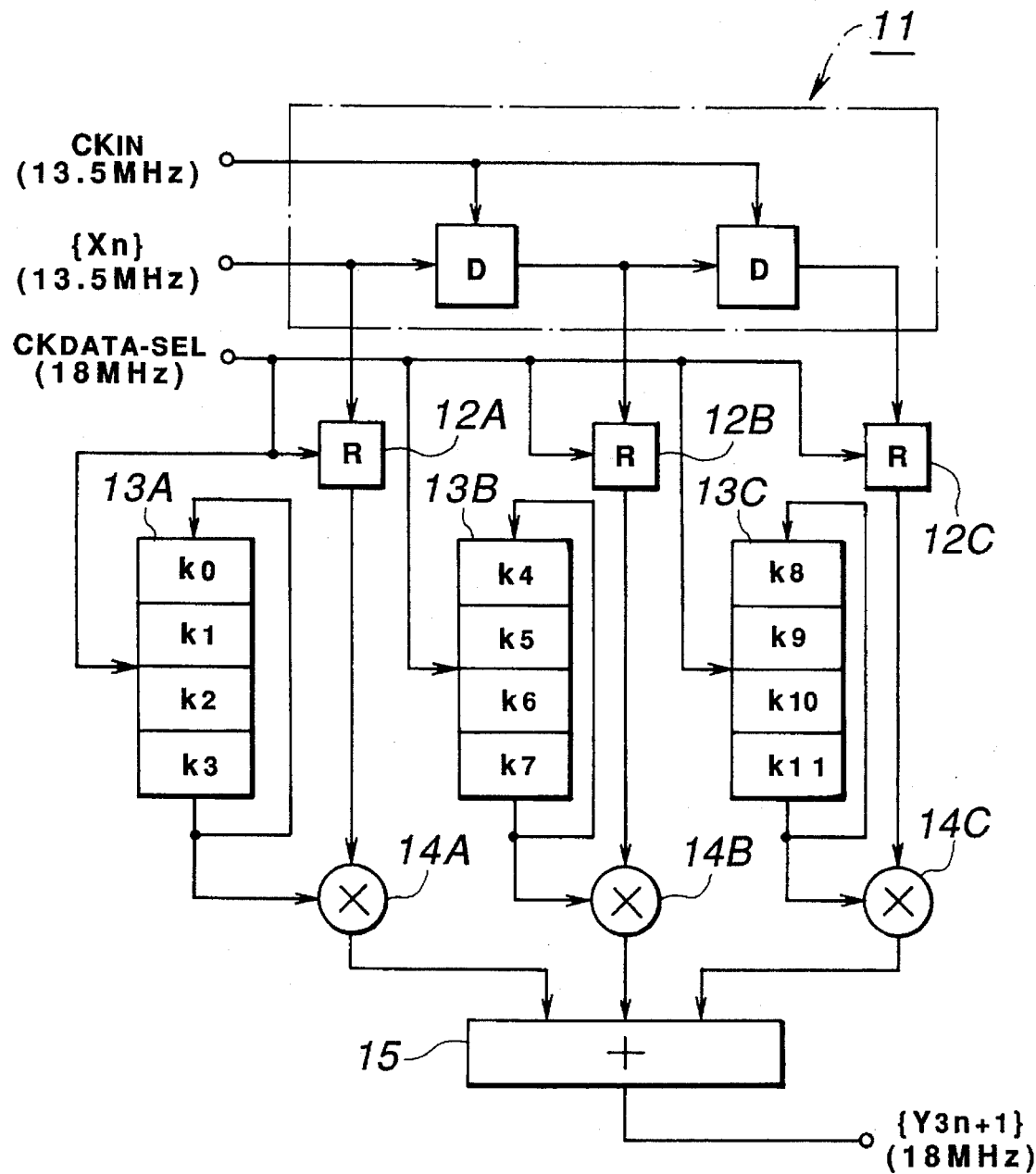
FIG. 6 is a block diagram showing the configuration of an up-rate converter according to this invention.

A rate converter according to this invention may be constituted as shown in FIG. 6, for example.

The rate converter shown in FIG. 6 is directed to the embodiment of an up-rate converter for converting an input signal (input data $\{X_n\}$) of a data rate of 13.5 MHz to an output signal (output data) of a data rate of 18 MHz. This up-rate converter comprises a two-stage shift register 1 having three output stages, and adapted for sequentially shifting the input signal (data contents of input data) at the input clock rate of 13.5 MHz; three latch circuits 12A, 12B, 12C connected to the output stages of the shift-register 1, and adapted for holding signals from the output stages and outputting the held signals at the output clock rate of 18 MHz; three coefficient generators 13A, 13B, 13C for generating filter coefficients at the output clock rate of 18 MHz; three multipliers for multiplying the held signals from the latch means 14A, 14B, 14C by the filter coefficients from the coefficient generating means 13A–13C, respectively; and an adder 15 for adding output signals from the multipliers 14A, 14B, 14C to output a down-rate converted signal.

In the rate converter shown in FIG. 6, input data $\{X_n\}$ of the data rate of 13.5 MHz is delivered to the shift register 11.

This shift register 11 become operative at the input data rate of 13.5 MHz by a clock $CK_{IN}$ to sequentially shift (delay) the input signal data contents of the input data $\{X_n\}$. Respective data contents from the output stages of the shift register 11 are delivered to the three latch circuits 12A, 12B and 12C. In this case, the input data $\{X_n\}$ is directly delivered to the first latch circuit 12A of the three latch circuits 12A, 12B and 12C, input data $\{X_n\}$ shifted (delayed) by one clock is delivered to the second latch circuit 12B, and input data $\{X_n\}$ shifted (delayed) by two clocks is delivered to the third latch circuit 12C.

These three latch circuits 12A, 12B and 12C is operated at the output clock rate of 18 MHz by a data select latch clock $CK_{DATA-SEL}$ to hold (latch) data contents of the input data $\{X_n\}$ sequentially shifted (delayed) by the three stage shift register 11. Respective latch outputs from these latch circuits 12A, 12B and 12C are delivered to the three multipliers 14A, 14B and 14C. In this case, a latch output of the first latch circuit 12A is delivered to the first multiplier 14A of the three multipliers 14A, 14B and 14C, a latch output of the second latch circuit 12B is delivered to the second multiplier 14B, and a latch output from the third latch circuit 12C is delivered to the third multiplier 14C.

Further, these three coefficient generators 13A, 13B and 13C sequentially generate, at the output clock rate of 18 MHz, in parallel four by four, filter coefficients Ki in the transfer function $F_2(z)$ indicated by the above-mentioned formula Namely, the first coefficient generator 13A of the three coefficient generators 13A, 13B and 13C repeatedly generates filter coefficients $K_3$, $K_2$, $K_1$, $K_0$. These filter coefficients $K_3$, $K_2$, $K_1$, $K_0$ generated by the first coefficient generator 13A are sequentially delivered to the first multiplier 14A at the output clock rate of 18 MHz. The second coefficient generator repeatedly generates filter coefficients $K_7$, $K_6$, $K_5$, $K_4$. These filter coefficients $K_7$, $K_6$, $K_5$, $K_4$ generated by the second coefficient generator 13B are sequentially delivered to the second multiplier 14B at the output clock rate of 18 MHz. The third coefficient generator 13C repeatedly generates filter coefficients $K_{11}$, $K_{10}$, $K_9$, $K_8$. These filter coefficients $K_{11}$, $K_{10}$, $K_9$, $K_8$ generated by the third coefficient generator 13C are sequentially delivered to the third multiplier 14C at the output clock rate of 18 MHz.

In addition, these three multipliers 14A, 14B and 14C sequentially carry out, at the output clock rate of 18 MHz, a multiplicative processing for multiplying respective latch outputs (held signals) from the three latch circuits 12A, 12B and 12C by filter coefficients Ki by the three coefficient generators 13A, 13B and 13C. Respective multiplied outputs by these multipliers 14A, 14B and 14C are delivered to the adder 15.

The adder 15 adds respective multiplied outputs by the multipliers 14A, 14B and 14C to thereby sequentially output data $\{Y_{3n+1}\}$ (up-rate converted signals), as indicated by the following formula (18), of the output clock rate of 18 MHz obtained by converting input data $\{X_n\}$ of the clock rate of 13.5 MHz.

$$Y_1 = k_3 \cdot X_3 + k_7 \cdot X_2 + k_{11} \cdot X_1$$

$$Y_4 = k_2 \cdot X_4 + k_6 \cdot X_3 + k_{10} \cdot X_2$$

$$Y_7 = k_1 \cdot X_5 + k_5 \cdot X_4 + k_9 \cdot X_3$$

$$Y_{10} = k_0 \cdot X_6 + k_4 \cdot X_5 + k_8 \cdot X_4$$

$$Y_{13} = k_3 \cdot X_6 + k_7 \cdot X_5 + k_{11} \cdot X_4$$

$$Y_{16} = k_2 \cdot X_7 + k_6 \cdot X_6 + k_{10} \cdot X_5 \quad (18)$$

$$Y_{19} = k_1 \cdot X_8 + k_5 \cdot X_7 + k_9 \cdot X_8$$

$$Y_{22} = k_0 \cdot X_9 + k_4 \cdot X_8 + k_8 \cdot X_7$$

$$Y_{25} = k_3 \cdot X_9 + k_4 \cdot X_8 + k_{11} \cdot X_7$$

$$Y_{28} = k_2 \cdot X_{10} + k_8 \cdot X_9 + k_{10} \cdot X_8$$

As stated above, the rate converter according to this invention is adapted to hold, at an output clock rate, by using the latch circuits, respective output signals (shifted data contents of the input data) from the output stages of the shift register operative at an input clock rate to multiply, by using the multipliers, these latch outputs (held signals) by respective filter coefficients that the coefficient generators sequentially generate at the output clock rate to add multiplied outputs by the adder to thereby provide a down-rate converted output signal or an up-rate converted output signal. Namely, without necessity of a digital filter operative at a high speed at a clock rate of the least common multiple of an input clock rate and an output clock rate, input data of an input clock rate can be converted to output data of a desired output clock rate by one digital filter.

Figure 7:
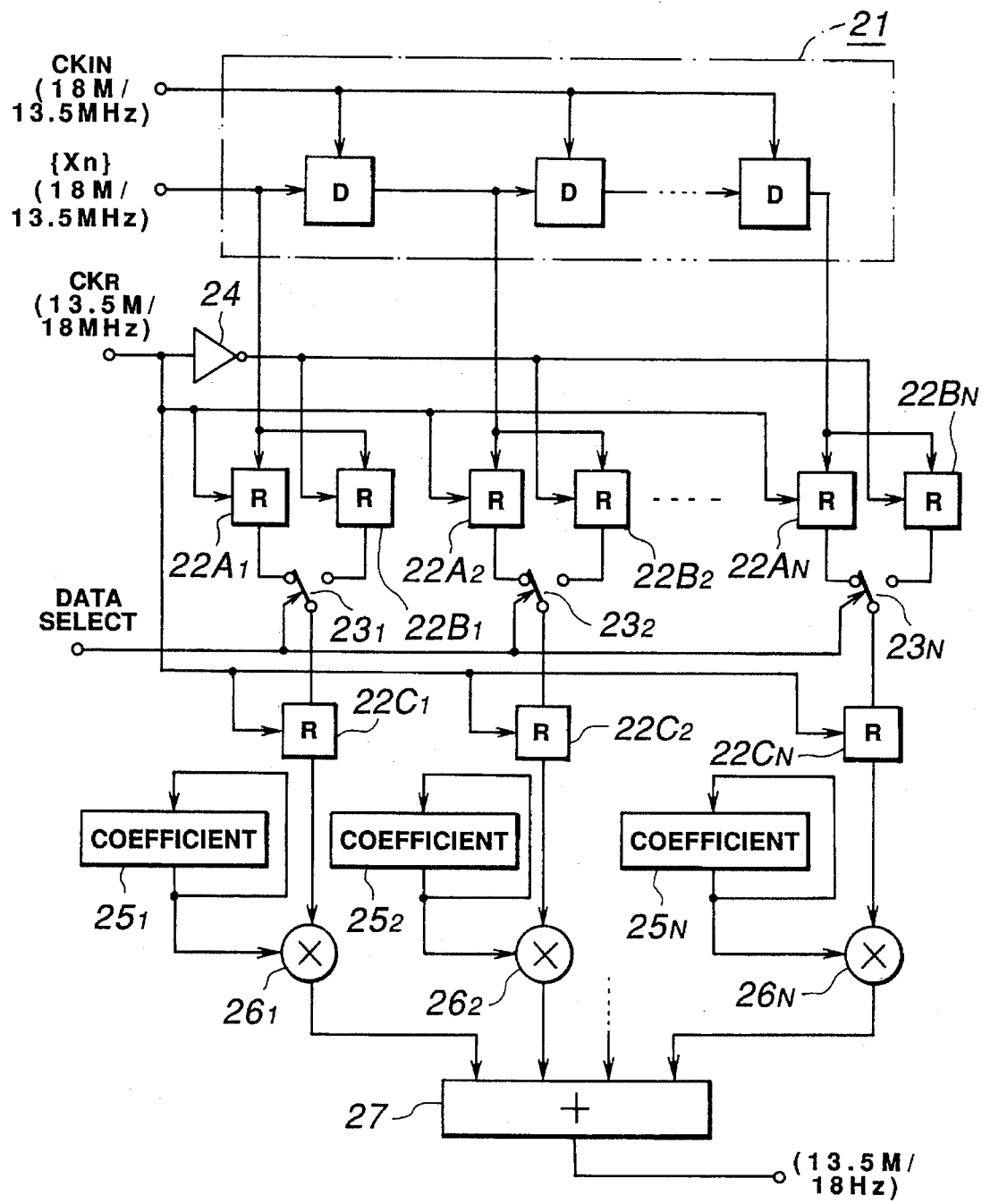
FIG. 7 is a block diagram showing the configuration of a rate converter according to this invention.

Further, a rate converter according to this invention may be constituted as shown in FIG. 7, for example.

The rate converter shown in FIG. 7 includes an (N−1) stage shift registers 21, 3N latch circuits $22A_1$, $22B_1$, $22C_1$~$22A_N$, $22B_N$, $22C_N$, N selector switches $23_1$~$23_N$, a single inverter 24, N coefficient generators $25_1$~$25_N$, N multipliers $26_1$~$26_N$, and a single adder 27.

In the rate converter shown in FIG. 7, input data $\{X_n\}$ of a clock rate of 18 MHz or 13.5 MHz is delivered to the (N−1) stage shift register 21. This shift registers 21 is operated at an input clock rate of 18 MHz or 13.5 MHz by a clock $CK_{IN}$ to sequentially shift (delay) the input data $\{X_n\}$). Respective output signals from the output stages of the (N−1) stage shift registers 21 (i.e., shifted data contents of the input data $\{X_n\}$ outputted therefrom) are delivered to the N multipliers $26_1$~$26_N$ through the latch circuits $22A_1$, $22B_1$, $22A_2$, $22B_2$~$22A_N$, $22B_N$, N selector switches $23_1$~$23_N$, and the latch circuits $22C_1$~$22C_N$.

In this case, the input data $\{X_n\}$ is directly delivered to the respective latch circuits $22A_1$, $22B_1$. Either of respective latch outputs (held signals) from these latch circuits $22A_1$, $22B_1$ is selected by the selector switch $23_1$, and the selected latch output (held signal) is delivered to the multiplier $26_1$ through the latch circuit $22C_1$. The input data $\{X_n\}$ shifted (delayed) by one clock by the shift register 21 is delivered to the respective latch circuits $22A_2$, $22B_2$. Either of respective latch outputs (held signals) from these latch circuits $22A_2$, $22B_2$ is selected by the selector switch $23_2$, and the selected held signal is delivered to the multiplier $26_2$ through the latch circuit $22C_2$. In a manner similar to the above, the input data $\{Xn\}$ shifted (delayed) by 2N clocks by the shift-register 21 are delivered to respective latch circuits $22A_2$, $22B_2$~$22A_N$, $22B_N$. Desired ones of respective latch outputs (held signals) from these latch circuits $22A_2$, $22B_2$~$22A_N$, $22B_N$ are respectively selected by the selector switches $23_2$~$23_N$, and the selected held signals are delivered to the multipliers $26_2$~$26_N$ through the latch circuits $22C_2$~$22C_N$.

Further, respective latch circuits $22A_1$, $22C_1$~$22A_N$, $22C_N$ of the 3N latch circuits $22A_1$, $22B_1$, $22C_1$~$22A_N$, $22B_N$, $22C_N$ carry out a latch (hold) operation at the output clock rate of 13.5 MHz or 18 MHz by an output clock $CK_R$, and other respective latch circuits $22B_1$~$22B_N$ carry out a latch (hold) operation at the output clock rate of 13.5 MHz or 18 MHz by an inverted clock obtained by inverting the output clock $CK_R$ by using the inverter 24.

Figure 8:
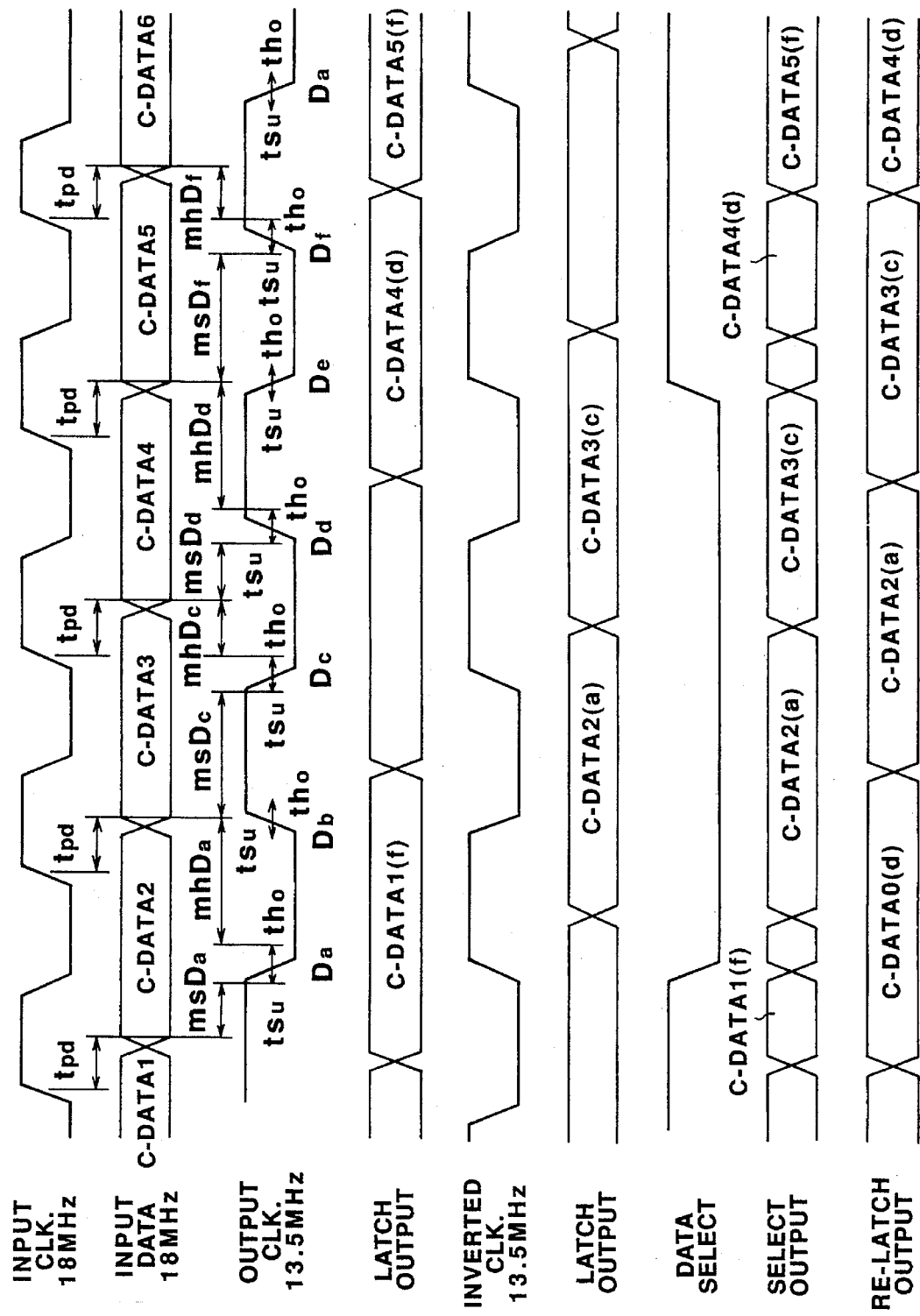
FIG. 8 is a timing chart showing the operation as a down-rate converter in the rate converter shown in FIG. 7.
Figure 9:
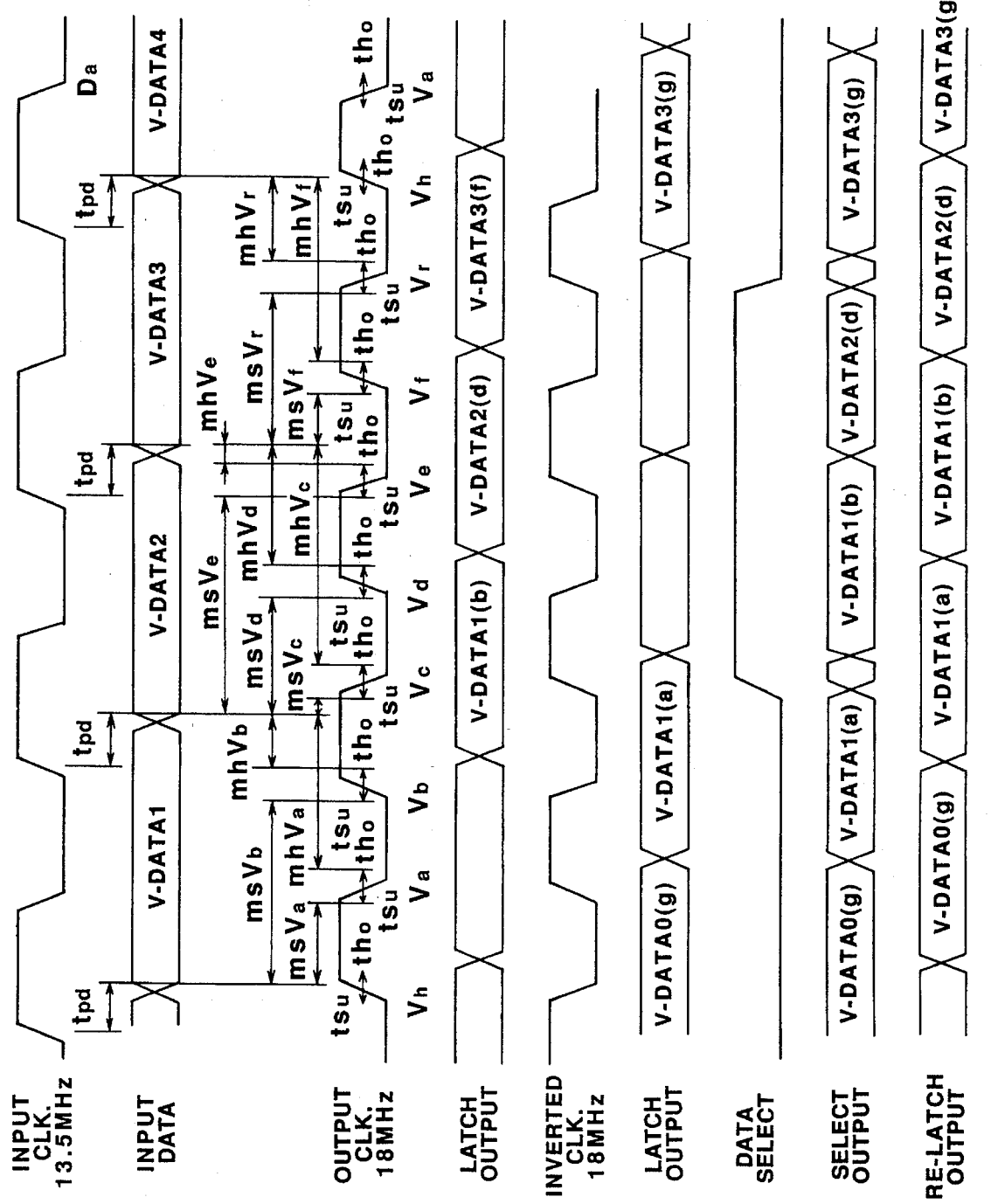
FIG. 9 is a timing chart showing the operation as an up-rate converter in the rate converter shown in FIG. 7.

For example, in the case of attempting to allow the rate converter shown in FIG. 7 to be operative as a down-rate converter for converting input data $\{X_n\}$ of a clock rate of 18 MHz to an output data $\{Y_{4n}\}$ of a clock rate of 13.5 MHz, input data $\{X_n\}$ of 18 MHz latched (held) as shown in FIG. 8 in parallel by an output clock of 13.5 MHz and its inverted clock by using latch circuits $22A_N$, $22B_N$. Then, desired ones of respective latch outputs (held signals) from these latch circuits $22A_N$, $22B_N$ are selected by the selector switch $23_N$. The selected latch outputs (held signals) are latched (held) for a second time by the latch circuit $22C_N$ at the output clock of 13.5 MHz. On the other hand, in the case of attempting to allow the rate converter of this embodiment to be operative as an up-rate converter for converting input data $\{X_n\}$ of a clock rate of 13.5 MHz to output data $\{Y_{4n}\}$ of a clock rate of 18 MHz, input data $\{X_n\}$ of 13.5 MHz are latched (held) in parallel by an output clock of 18 MHz and its inverted clock by using latch circuits $22A_N$, $22B_N$. Desired ones of respective latch outputs of the latch circuits $22A_N$, $22B_N$ are selected by the selector switch $23_N$. The selected latch outputs (held signals) are latched (held) for a second time by the latch circuit $22C_N$ at the output clock of 18 MHz.

Namely, in this rate converter, the latch means for holding, at the output rate, data contents of the input data $\{X_n\}$ shifted (delayed) by the shift register 21 at the output rate are comprised of the 3N latch circuits $22A_1$, $22B_1$, $22C_1$~$22A_N$, $22B_N$, $22C_N$ and N selector switches $23_1$~$23_N$. Respective shifted contents of the input data $\{X_n\}$ from the output stages by the shift register 21 are latched (held) in parallel by an output clock and its inverted clock by using the latch circuits $22A_1$, $22C_1$~$22A_N$, $22C_N$. Desired ones of respective latch outputs (held signals) are selected by the selector switches $23_1$~$23_N$. These latch outputs thus selected are held for a second time at an output clock by using the latch circuits $22C_1$~$22C_N$. Thus, input data $\{X_n\}$ of the input clock rate can be securely latched (held) at the output clock rate by using the latch circuits $22C_1$~$22C_N$.

In addition, the N multipliers $26_1$~$26_N$ sequentially carry out, at the output rate of 13.5 MHz or 18 MHz, a multiplicative processing for multiplying in parallel respective latch outputs (held signals) from the latch circuits $22C_1$~$22C_N$ by using coefficients $K_i$ by the N coefficient generators $25_1$~$25_N$.

In this case, in the above-described rate converter shown in FIG. 7, if an approach is employed to carry out, by using the selector switch 23, switching between an output clock of the output clock rate and the inverted clock of the output clock by the inverter 24 to deliver them to respective latch circuits $22A_1$~$22A_N$, provision of N latch circuits $22B_1$~$22B_N$ and selector switches $23_1$~$23_N$ may be omitted. As a result, as in the embodiment shown in FIG. 10, a rate converter can be constituted by (N–1) stage shift registers 21, 2N latch circuits $22A_1$, $22C_1$~$22A_N$, $22C_N$, a single selector switch 23, a single inverter 24, N coefficient generators $35_1$~$35_N$, N multipliers $26_1$~$26_N$, and a single adder 27.

Figure 10:
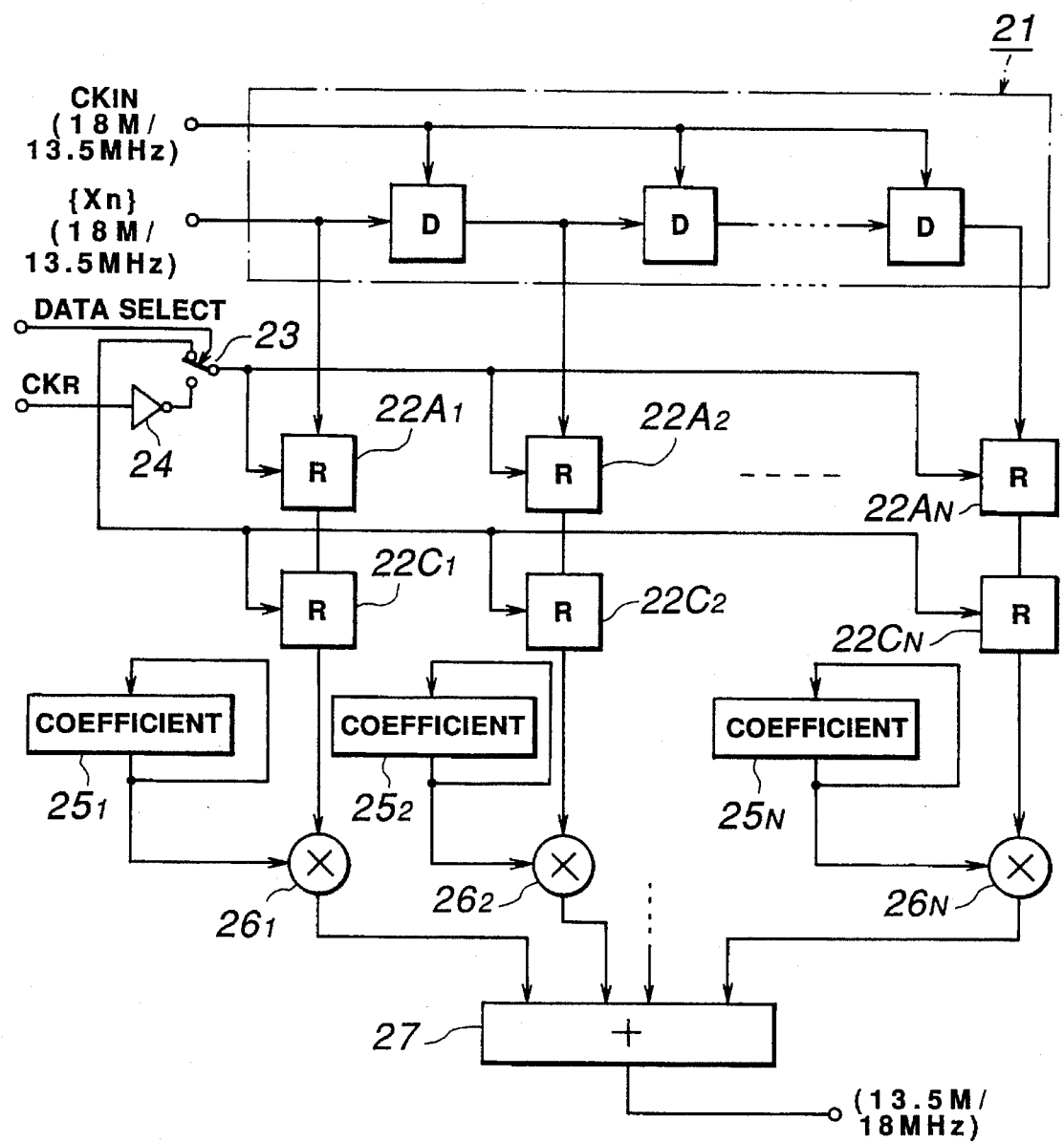
FIG. 10 is a block diagram showing another configuration of a rate converter according to this invention.
Figure 11:
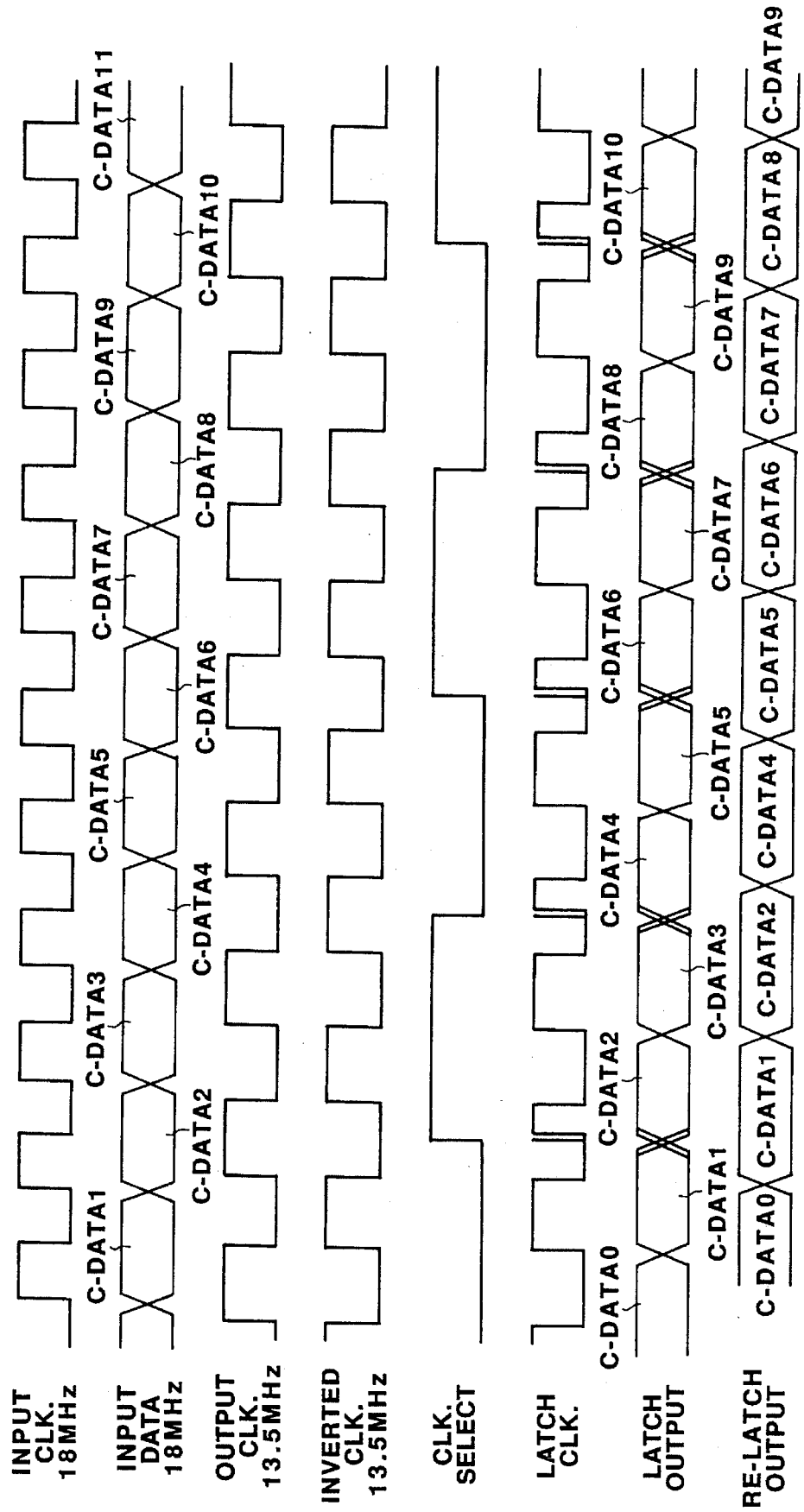
FIG. 11 is a timing chart showing the operation as a down-rate converter in the rate converter shown in FIG. 10.
Figure 12:
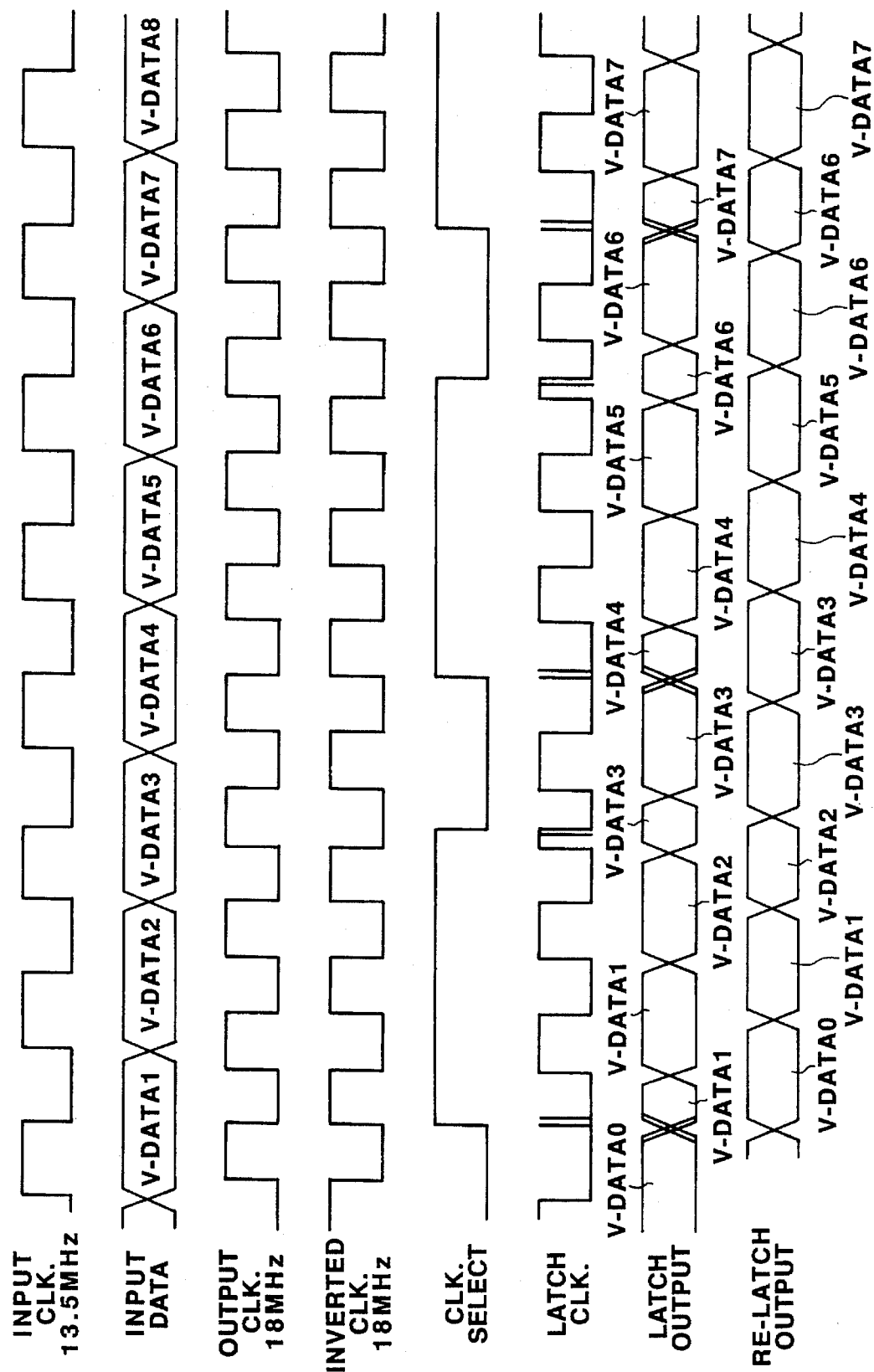
FIG. 12 is a timing chart showing the operation as an up-rate converter in the rate converter shown in FIG. 10.

In the rate converter shown in FIG. 10, in the case of attempting to allow it to be operative as a down-rate converter for converting input data $\{X_n\}$ of a clock rate of 18 MHz to output data $\{Y_{4n}\}$ of a clock rate of 13.5 MHz, respective shifted (delayed) data contents output of the input data $\{X_n\}$ of 18 MHz by the shift register 21 are latched (held), as shown in FIG. 11, by an output clock of 13.5 MHz and its inverted clock by using the latch circuits $22A_1$~$22A_N$. As a result, latch outputs (held signals) from these latch circuits $22A_1$~$22A_N$ are latched (held) for a second time by using the latch circuits $22C_1$~$22C_N$ at the output clock of 13.5 MHz. On the other hand, in the case of attempting to allow the rate converter of this embodiment to be operative as an up-rate converter for converting input data $\{X_n\}$ of a clock rate of 13.5 MHz to output data $\{Y_n\}$ of a clock rate of 18 MHz, respective shifted (delayed) data contents by the shift register 21 are latched by an output clock of 18 MHz and its inverted clock by using the latch circuits $22A_1$~$22A_N$. Respective latch outputs (held signals) from these latch circuits $22A_1$~$22A_N$ are latched (held) for a second time by using the latch circuits $22C_1$~$22C_N$ at the output clock of 18 MHz.

In addition, in the above-described rate converter shown in FIG. 10, it is sufficient that respective latch circuits $22A_1$~$22A_N$ for latching (holding) respective shifted (delayed) data contents of the input data $\{X_n\}$ by the shift register 21 latch (hold) data required for output data of the output clock rate, and it is not necessarily required that those latch circuit carry out a latch (hold) operation by the output clock and its inverted clock.

Figure 13:
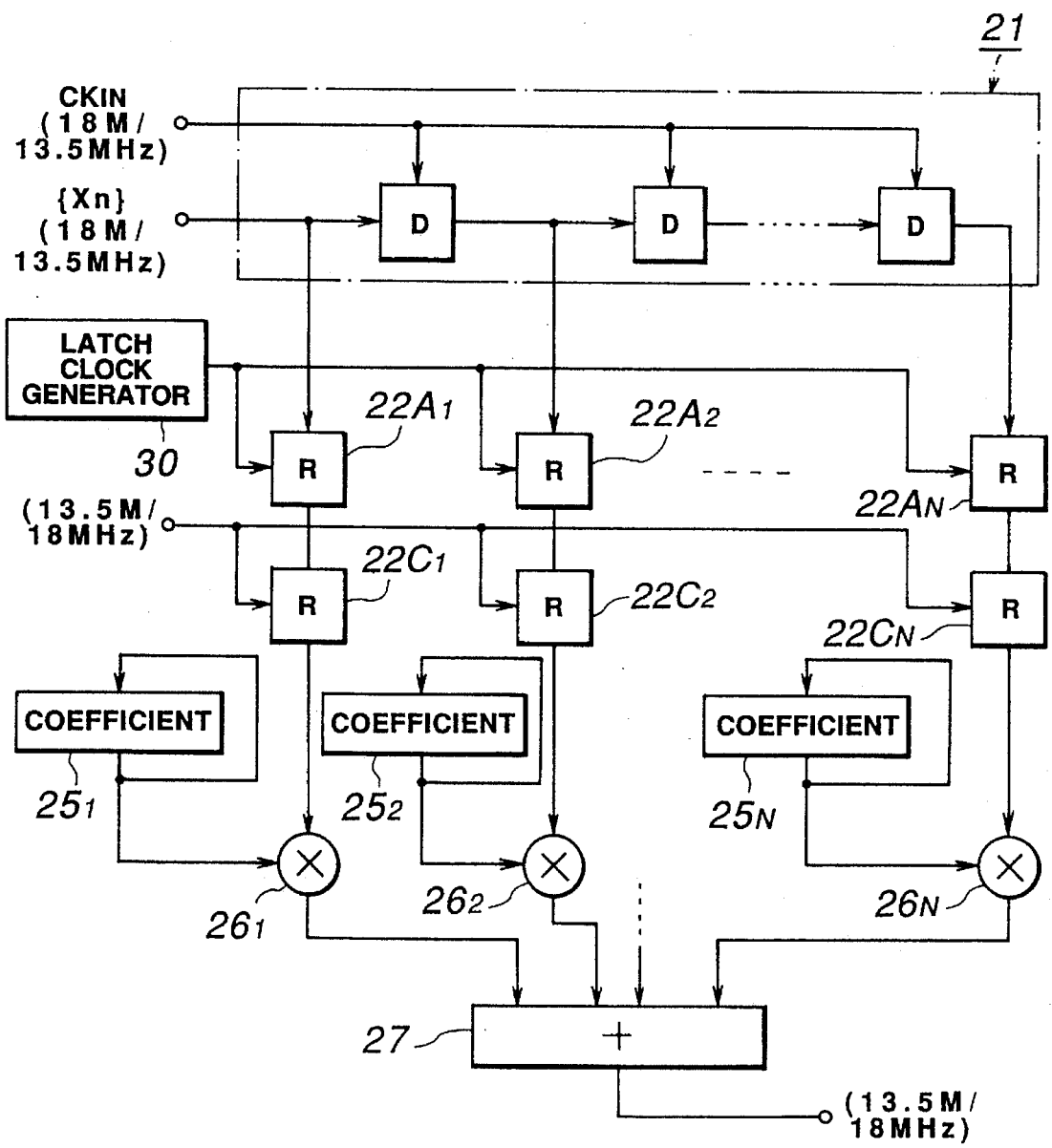
FIG. 13 is a block diagram showing a further configuration of a rate converter according to this invention.
Figure 14:
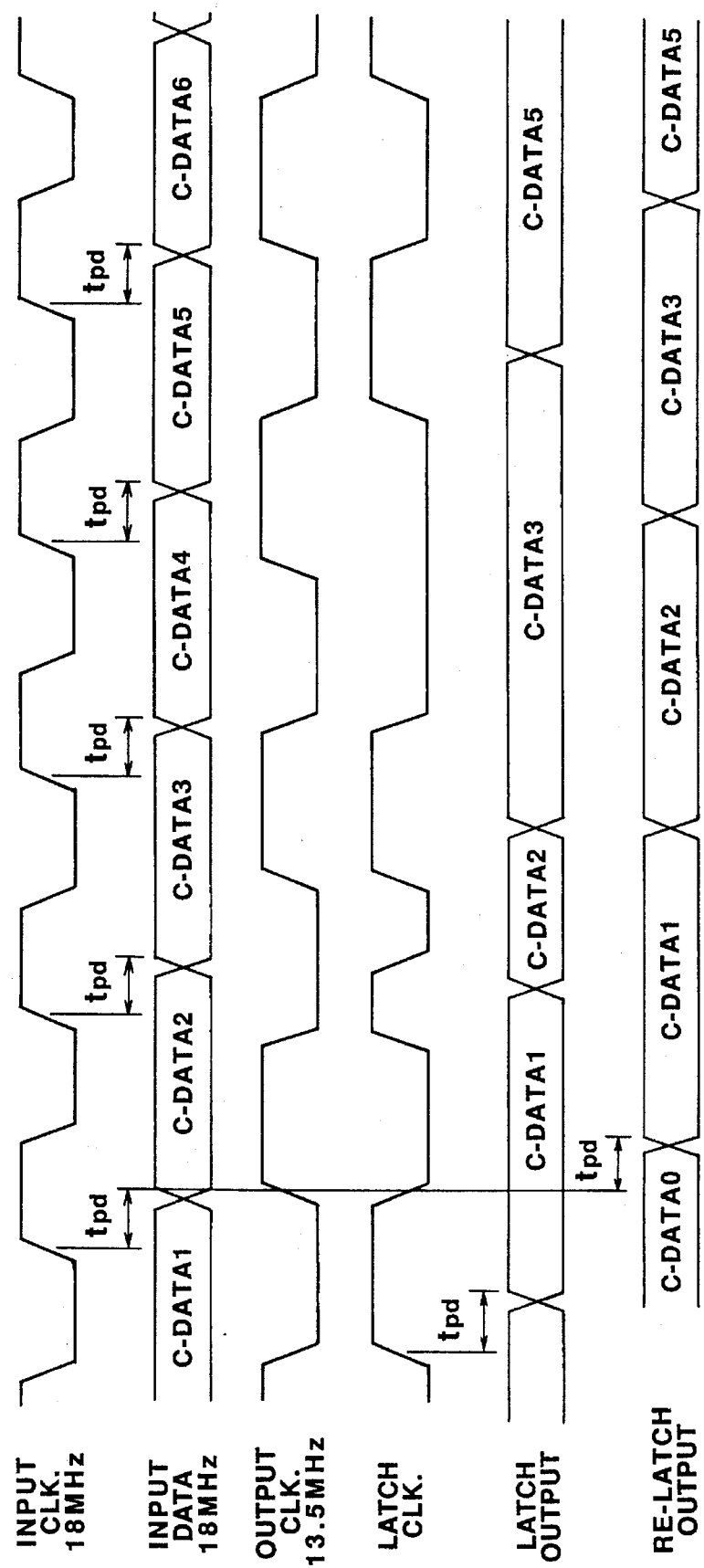
FIG. 14 is a timing chart showing the operation as a down-rate converter in the rate converter shown in FIG. 13.
Figure 15:
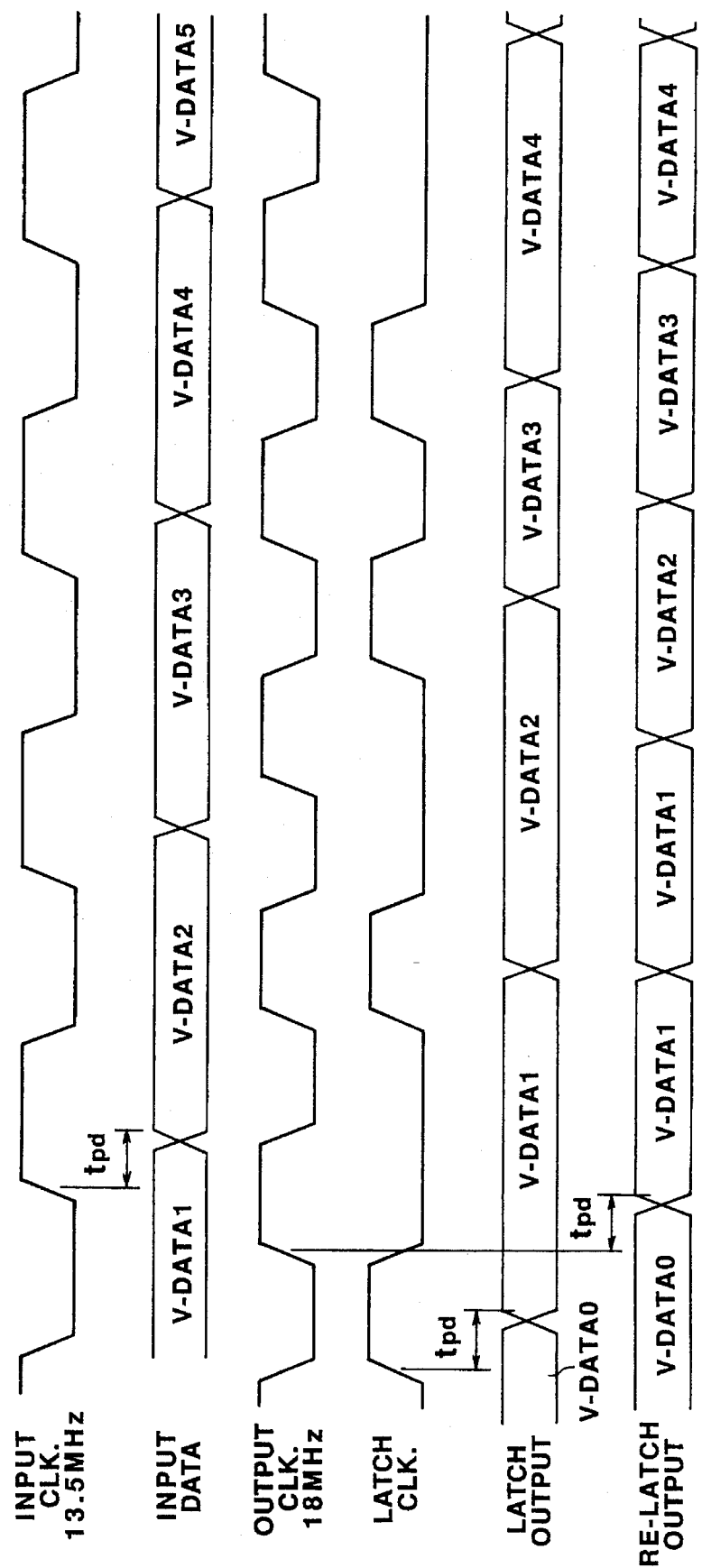
FIG. 15 is a timing chart showing the operation as an up-rate converter in the rate converter shown in FIG. 13.

Accordingly, in place of the selector switch 23 and the inverter 24 for delivering an output clock and its inverted clock to the respective latch circuits $22A_1$~$22A_N$, a rate converter in an example as shown in FIG. 13 may be employed. Namely, a latch clock generator 30 for delivering a latch clock to respective latch circuits $22A_1$~$22A_N$ is provided to latch (hold) respective signals shifted (delayed) data contents of the input data $\{X_n\}$ by the shift register 21 by a latch clock of a timing as shown in FIG. 14 by using the respective latch circuits $22A_1$~$22A_N$ to allow that rate converter to be operative as a down-rate converter, or to latch (hold) respective shifted (delayed) data contents of the input data $\{X_n\}$ by the shift register 21 by a latch clock of a timing as shown in FIG. 15 by using the respective latch circuits $22A_1$~$22A_N$, thus to allow that rate converter to be operative as an up-rate converter.

Figure 16:
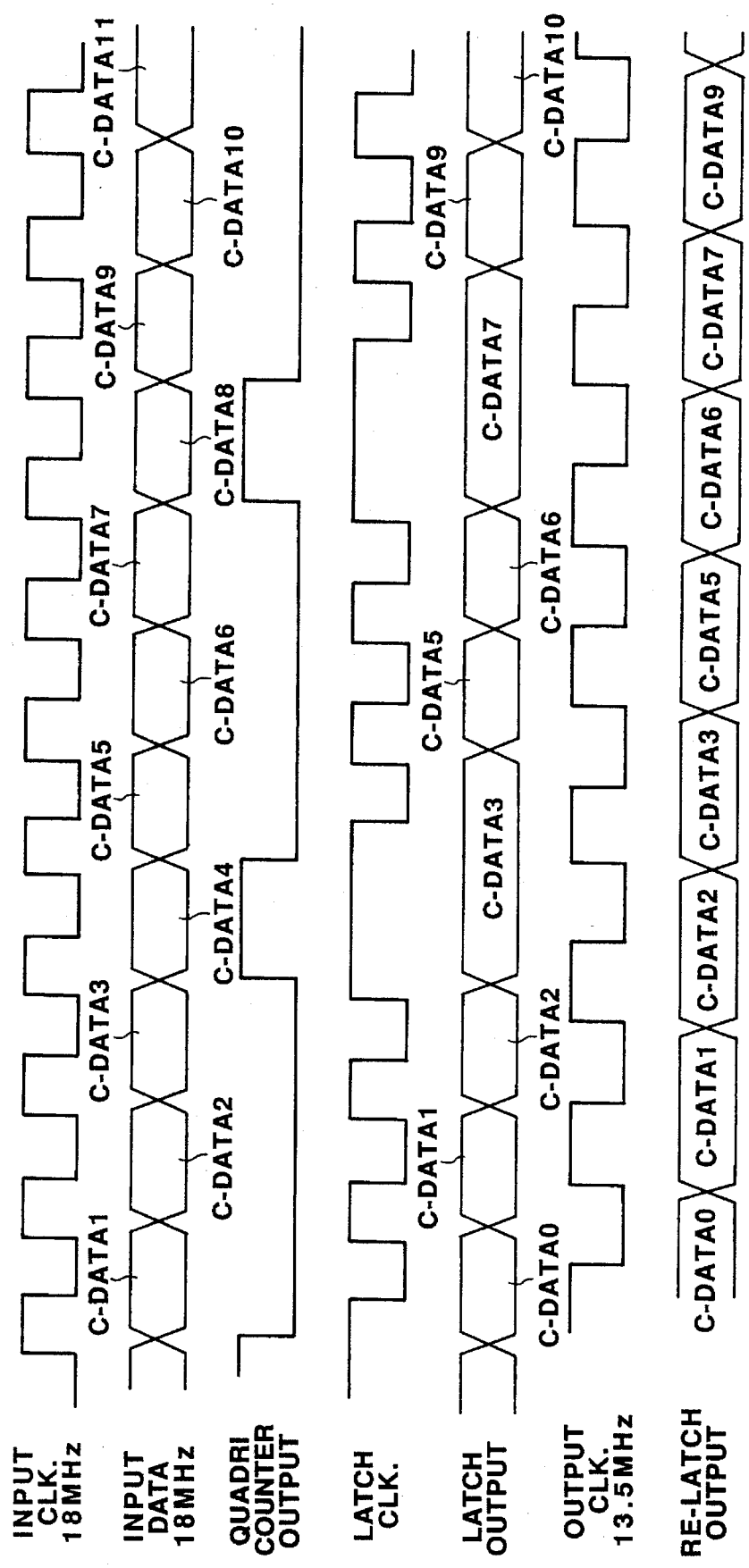
FIG. 16 is a timing chart showing another operation as a down-rate converter in the rate converter shown in FIG. 13.
Figure 17:
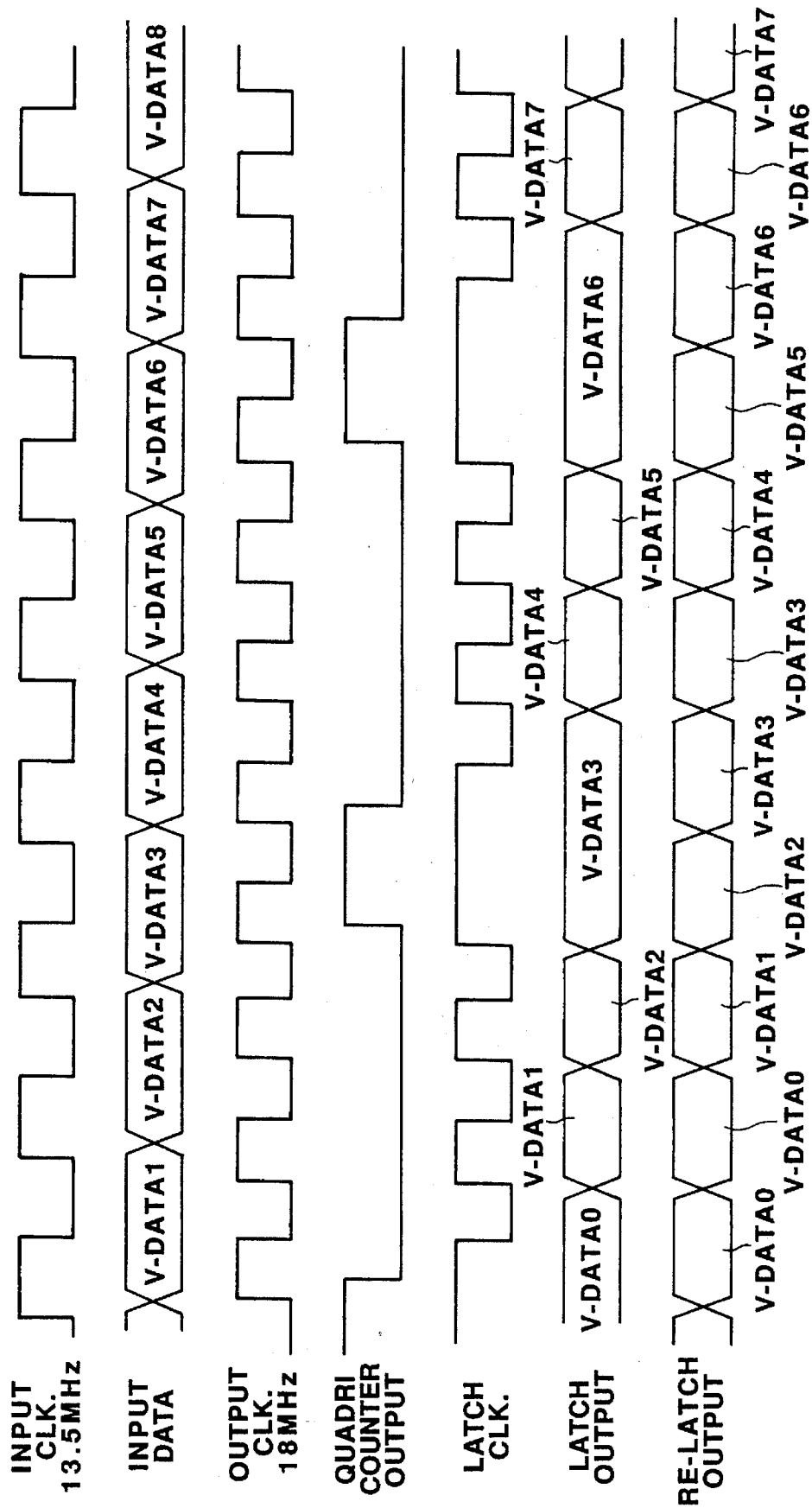
FIG. 17 is a timing chart showing another operation as an up-rate converter in the rate converter shown in FIG. 13.

In addition, in the rate converter of an example shown in FIG. 13, a latch clock of a timing as shown in FIG. 16 is generated from an input clock of 18 MHz and a clock of a frequency of one fourth thereof at the latch clock generator 30 to latch (hold) respective signals shifted (delayed) data contents of the input data $\{X_n\}$ by the shift register by using the respective latch circuits $22A_1$~$22A_N$, thus permitting that rate converter to be operative as a down-rate converter; or a latch clock of a timing as shown in FIG. 17 is generated from an output clock of 18 MHz and a clock of a frequency of one fourth thereof at the latch clock generator 30 to latch (hold) shifted (delayed) data contents of the input data $\{X_n\}$ by the shift register 21 by using the respective latch circuits $22A_1$~$22A_N$, thereby permitting that rate converter to be operative as an up-rate converter.

What is claimed is:

1. A rate converter for Converting data rate of an input signal, comprising:

shift-register means having a plurality of output stages, and adapted for sequentially shifting said input signal at an input clock rate of said input signal;.

latch means connected to said output stages, and adapted for holding signals from said output stages and outputting the held signals at an output clock rate different from said input clock rate;

coefficient generating means for generating filter coefficients at said output clock rate;

multiplier means for multiplying said held signals from said latch means by said filter coefficients from said coefficient generating means, respectively; and adding means for adding output signals from said multiplier means to output a rate converted signal.

2. A rate converter as set forth in claim 1, wherein said latch means comprises first latch means for holding signals from said output stages by an output clock at said output clock rate, second latch means for holding signals from said output stages by an inverted output clock at said output clock rate, switch means for selectively outputting held signals from said first and second latch means, and third latch means for holding signals from said switch means by said output clock.

3. A rate converter as set forth in claim 1, wherein said latch means comprises switch means for selectively outputting an output clock at said output clock rate and an inverted output clock at said output clock rate, first latch means for holding signals from said respective output stages by said output clock or said inverted output clock outputted from said switch means, and second latch means for holding held signals from said first latch means by said output clock.

4. A rate converter as set forth in claim 1, wherein said latch means comprises latch clock generating means for generating a latch clock signal at said output clock rate, first latch means fop holding signals from said output stages by said latch clock signal, and second latch means for holding held signals from said first latch means by an output clock at said output clock rate.

5. A rate converter as set forth in claim 1, wherein said input signal and said rate converted signal are a digital signal.

6. A down-rate converter for converting data rate of an input signal, comprising:

a three stage shift-register having four output stages, and adapted for sequentially shifting said input signal at an input clock rate of said input signal;

four latches connected to said output stages, and adapted for holding signals from said output stages, and outputting the held signals at an output clock rate different from said input clock rate;

four coefficient generator for generating filter coefficients in a predetermined order at said output clock rate;

four multipliers for multiplying said held signals from said latches by said filter coefficients from said coefficient generating means, respectively; and an adder for adding output signals from said multipliers to output a down-rate converted signal.

7. An up-rate converter for converting data rate of an input signal, comprising:

a two-stage shift-register having three output stages, and for sequentially shifting said input signal at an input clock rate of said input signal;

three latches connected to said output stages, and adapted for holding signals from said output stages, and outputting the held signals at an output clock rate different from said input clock rate;

three coefficient generators for generating filter coefficients in a predetermined order at said output clock rate;

three multipliers for multiplying said held signals from said latches by said filter coefficients from said coefficient generating means, respectively; and an adder for adding output signals from said multipliers to output an up-rate converted signal.

* * * * *